(12) United States Patent
Lee et al.

(10) Patent No.: US 12,557,700 B2
(45) Date of Patent: Feb. 17, 2026

(54) DISPLAY DEVICE USING MICRO LED AND MODULE-TYPE DISPLAY DEVICE USING SAME

(71) Applicant: LG ELECTRONICS INC., Seoul (KR)

(72) Inventors: Sungguk Lee, Seoul (KR); Dohyung Lee, Seoul (KR); Sangdae Park, Seoul (KR); Jaegwang Um, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 740 days.

(21) Appl. No.: 17/909,232

(22) PCT Filed: Jul. 29, 2020

(86) PCT No.: PCT/KR2020/010009
§ 371 (c)(1),
(2) Date: Sep. 2, 2022

(87) PCT Pub. No.: WO2021/177516
PCT Pub. Date: Sep. 10, 2021

(65) Prior Publication Data
US 2023/0087374 A1  Mar. 23, 2023

Related U.S. Application Data

(60) Provisional application No. 62/984,734, filed on Mar. 3, 2020.

(51) Int. Cl.
H01L 27/12 (2006.01)
H01L 25/16 (2023.01)
(Continued)

(52) U.S. Cl.
CPC ......... H01L 25/167 (2013.01); H10D 86/411 (2025.01); H10D 86/441 (2025.01);
(Continued)

(58) Field of Classification Search
CPC .................. H01L 25/167; H01L 24/08; H01L 2224/08145; H01L 2924/12041;
(Continued)

(56) References Cited

U.S. PATENT DOCUMENTS 11,881,473 B2 *  1/2024  Lee ........................ H10H 20/01
2014/0167052 A1  6/2014  Park et al.
2015/0055041 A1  2/2015  Jiang et al.

FOREIGN PATENT DOCUMENTS

KR   10-2017-0030464 A    3/2017
KR   10-2017-0038605 A    4/2017
(Continued)

Primary Examiner — Elmito Breval
(74) Attorney, Agent, or Firm — Birch, Stewart, Kolasch & Birch, LLP

(57) ABSTRACT

The present invention can be applied to a technical field regarding a display device, and relates to, for example, a display device using a micro light-emitting diode (LED) and a module-type display device using same. The display device of the present invention may comprise: a first substrate comprising a first electrode placed on a first surface and a second electrode placed on a second surface and electrically connected to the first electrode; a second substrate placed on the first substrate and comprising a connection wire that defines multiple individual pixel regions—the second substrate being placed on the first substrate so as to have an exposure part through which at least a part of the first electrode of the first substrate is exposed; a connection electrode connecting the first electrode of the first substrate to the connection wire of the second substrate while being in contact with the exposure part; and light-emitting diodes connected to the connection wire of the second substrate.

18 Claims, 21 Drawing Sheets

(51) Int. Cl.
*H10D 86/40* (2025.01)
*H01L 23/00* (2006.01)
(52) U.S. Cl.
CPC .... *H01L 24/08* (2013.01); *H01L 2224/08145* (2013.01); *H01L 2924/12041* (2013.01)
(58) Field of Classification Search
CPC ... H01L 24/85; H01L 25/0753; H01L 23/498; H01L 23/528; H01L 23/538; H01L 25/075; H10D 86/411; H10D 86/441; H05K 1/189; H05K 2201/10106; H05K 2201/10128; H05K 1/11; H10H 20/857; H10H 29/142
See application file for complete search history.

(56) References Cited

FOREIGN PATENT DOCUMENTS

| | | |
|---|---|---|
| KR | 10-2017-0101064 A | 9/2017 |
| KR | 10-2019-0068112 A | 6/2019 |

\* cited by examiner

DISPLAY DEVICE USING MICRO LED AND MODULE-TYPE DISPLAY DEVICE USING SAME

CROSS REFERENCE TO RELATED APPLICATIONS

This application is the National Stage filing under 35 U.S.C. 371 of International Application No. PCT/KR2020/010009, which claims priority under 35 U.S.C. 119 (e) to U.S. Provisional Application No. 62/984,734, filed on Mar. 3, 2020, the entire contents of all these applications being hereby expressly incorporated by reference into the present application.

TECHNICAL FIELD

The present disclosure applicable to a technical field related to a display device relates to, for example, a display device using a micro light emitting diode (LED) and a module-type display device using the same.

BACKGROUND ART

Recently, a display device having excellent characteristics in terms of thinness and flexibility has been developed in the field of display technology. Major displays currently commercialized are represented by the liquid crystal display (LCD) and active matrix organic light emitting diodes (AMOLED).

A light emitting diode (LED) is a well-known semiconductor light emitting element that converts electrical current into light, and has been employed as a light source for displaying images on electronic devices including information and communication devices. LEDs include a red LED, which is the first LED commercialized in 1962 based on a GaAsP compound semiconductor, and a GaP:N-based green LED. Accordingly, a method of addressing the existing issues by implementing a display using a semiconductor light emitting element may be proposed. Compared to a filament-based light emitting element, the LED has various advantages such as a long service life, low power consumption, excellence in initial driving, and high vibration resistance.

For a display employing semiconductor light emitting elements, the semiconductor light emitting elements corresponding to individual pixels are required to be connected to a substrate. Accordingly, it may be relatively difficult to implement a high definition large-screen display.

In this regard, a large-area display device may be implemented by combining various displays as modules. In this case, the bezel area, which is an edge area of the display, may be required to be reduced. The technology used for this purpose is called zero bezel technology.

Basically, in implementing the zero bezel technology, substrates and electrodes are likely to be damaged when exposed to an external impact and stimulation. In addition, it is difficult to implement a zero bezel with a narrow pitch.

Methods for implementing such a zero bezel technology may be divided into printing upper and lower wires on a side surface with a conductive material and bending a flexible substrate rearward.

First, according to the former method of printing upper and lower wires on a side surface with a conductive material, a glass substrate is used and the side surface is processed. Accordingly, the glass is very likely to be damaged even by a small external impact applied during installation or handling of the substrate.

In addition, since the vertical connection wire is on the side surface, the electrode may be damaged by external contact, resulting in increase in resistance or disconnection.

According to the latter method of bending a flexible substrate rearward, when a wire connector is bent, an internal electrode may be damaged, resulting in increase in resistance or disconnection.

In addition, due to the thickness of the flexible substrate, the electrode, the radius of curvature has a certain limit. Accordingly, and the protective layer, it is difficult to implement a zero bezel with a narrow pitch and to uniformly bend the substrate of a large area.

Therefore, there is a need for a method to address the issues related to the conventional zero bezel technology.

DISCLOSURE

Technical Problem

An object of the present disclosure devised to address the problems is to provide a display device using a micro LED capable of implementing a narrow bezel area and a module-type display device using the same.

Another object of the present disclosure is to provide a display device using a micro LED capable of preventing damage to substrates and electrodes in implementing the display device, and a module-type display device using the same.

Another object of the present disclosure is to provide a display device using a micro LED capable of implementing a space-efficient and design-efficient high-resolution zero-bezel display and thus allowing a large-area high-resolution zero-bezel display to be manufactured, and a module-type display device using the same.

Another object of the present disclosure is to provide a display device using a micro LED capable of improving reliability and quality of the display device by enabling efficient wiring and preventing damage to electrodes and substrates, and a module-type display device using the same.

Technical Solution

In one aspect of the present disclosure to achieve the objects of the present disclosure, a display device may include a first substrate including a first electrode disposed on a first surface and a second electrode electrically connected to the first electrode, the second electrode being disposed on a second surface, a second substrate disposed on the first substrate and including a connection wire defining a plurality of individual pixel regions, the second substrate having an exposure portion exposing at least a portion of the first electrode of the first substrate, a connection electrode contacting the exposed portion to connect the first electrode of the first substrate and the connection wire of the second substrate to each other, and a light emitting element connected to the connection wire of the second substrate.

The first substrate may be a printed circuit board (PCB), wherein the first electrode and the second electrode may be electrodes printed on the PCB.

The second substrate may be a thin film transistor (TFT) substrate having a TFT provided in the pixel regions.

The TFT may have a drain electrode connected to the connection wire.

The display device may further include a third electrode connecting the first electrode to the second electrode.

The third electrode may connect the first electrode to the second electrode through the first substrate.

The exposure portion may be disposed at an end portion of the second substrate.

A width of the second substrate may be less than a width of the first substrate.

The exposure portion may be provided by exposing an edge side of the first substrate by the end portion of the second substrate.

The exposed portion may be a through portion provided at an end portion of the second substrate.

The connection electrode may connect the first electrode of the first substrate and the connection wire of the second substrate to each other through the through portion.

A width of the second substrate connected be substantially equal to a width of the first substrate.

In another aspect of the present disclosure, provided herein is a module-type display device having at least two display modules combined with each other. Each of the modules may include a first substrate including a first electrode disposed on a first surface and a second electrode electrically connected to the first electrode, the second electrode being disposed on a surface opposite to the first surface, a second substrate disposed on the first substrate and including a connection wire defining a plurality of individual pixel regions, wherein the second substrate has an exposure portion exposing at least a portion of the first electrode of the first substrate and is a flexible substrate thinner than the first substrate, a connection electrode arranged to contact the exposure portion to connect the first electrode of the first substrate and the connection wire of the second substrate to each other, and a light emitting element connected to the connection wire of the second substrate.

The second substrate may be a flexible substrate.

The second substrate may be a resin substrate.

Each of the display modules may further include a flattened layer disposed on the second substrate, and a protective layer disposed at an edge side of the first substrate and at an end portion of the flattened layer.

The at least two modules arranged adjacent to each other to have the above configuration may be bonded to each other.

The protective layers of the two adjacent modules may be arranged to contact each other.

Advantageous Effects

According to an embodiment of the present disclosure, the following effects may be provided.

First, according to an embodiment of the present disclosure, damage to a substrate and electrodes may be prevented when a display device is implemented.

In addition, when a high-resolution display device having pixels of a narrow pitch is manufactured, a connection electrode may be locally configured using an exposure portion, thereby enabling a narrow bezel display, a so-called zero bezel display to be effectively manufactured. In addition, a space-efficient and design-efficient high-resolution display may be implemented. Therefore, a large-area high-resolution zero-bezel display may be manufactured.

As described above, efficient wire connection may be implemented and damage to the electrodes and the substrates may be prevented. Accordingly, the reliability and quality of the display device may be improved.

Furthermore, according to another embodiment of the present disclosure, additional advantageous and advantageous effects not mentioned herein may be understood by those skilled in the art upon examination of the entirety of the specification and drawings.

BEST MODE

Hereinafter, embodiments disclosed in this specification will be described in detail with reference to the accompanying drawings. The same or similar components are given the same reference numbers and redundant description thereof is omitted. The suffixes "module" and "unit" for elements herein are used for convenience of description and thus are used interchangeably and do not have any distinguishable meanings or functions.

Further, in the following description of embodiments of the present disclosure, a detailed description of known technology incorporated herein will be omitted to avoid obscuring the subject matter of the embodiments. It should be noted that the accompanying drawings are merely provided to facilitate understanding of the embodiments disclosed in this specification and are not to be construed as limiting the technical spirit disclosed in the present disclosure.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between the elements.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in this specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it may be easily understood by those skilled in the art that the configuration according to an embodiment described in the present disclosure may be applied even to a display device in the form of a new product that will be developed in the future.

In addition, a semiconductor light emitting element mentioned in the present disclosure includes an LED and a micro LED.

Figure 1:
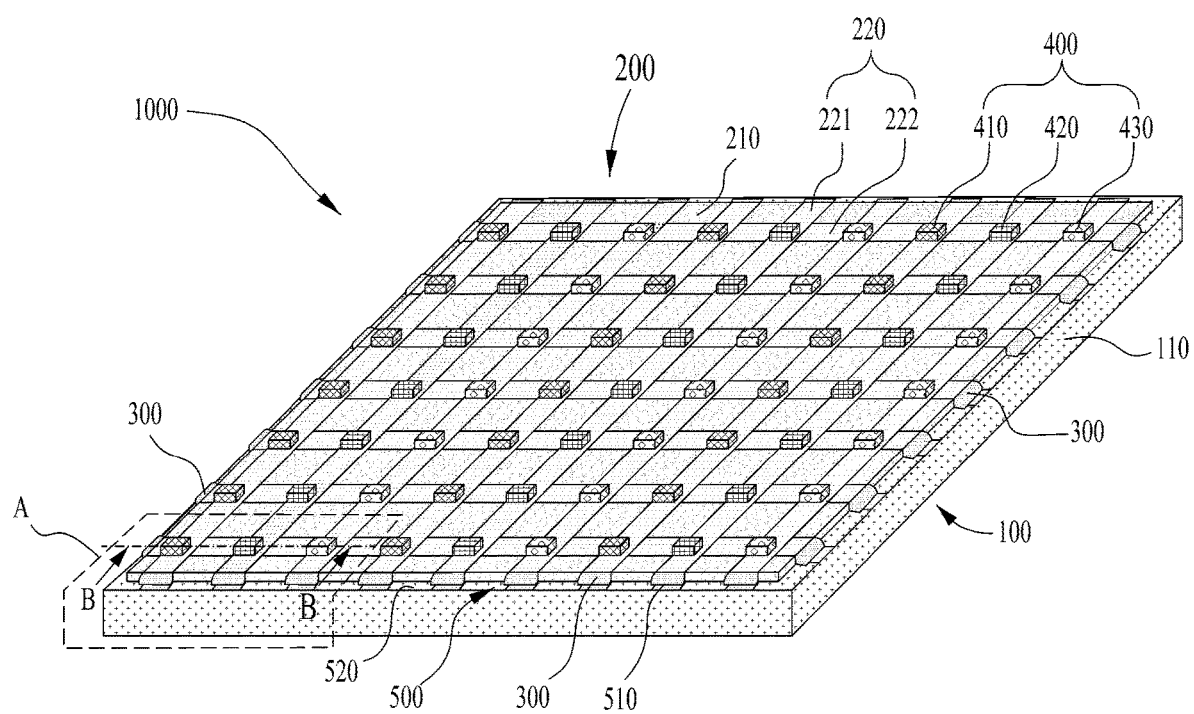
FIG. 1 is a perspective view showing a display device according to a first embodiment of the present disclosure.
Figure 2:
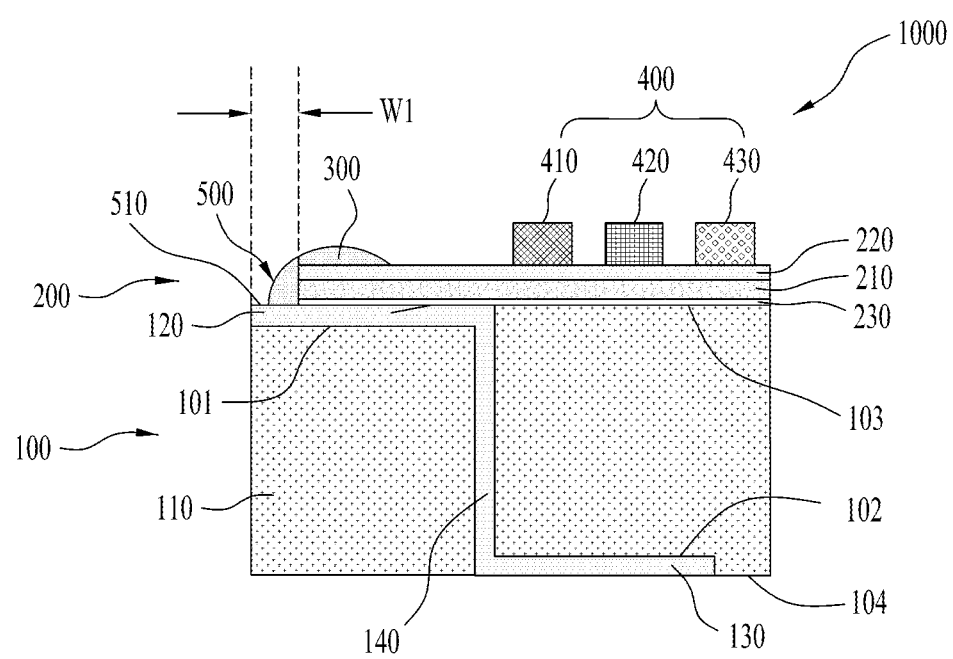
FIG. 2 is a cross-sectional view of part A, taken along line B-B in FIG. 1.

FIG. 1 is a perspective view showing a display device according to a first embodiment of the present disclosure. FIG. 2 is a cross-sectional view of part A, taken along line B-B in FIG. 1.

FIG. 1 is an enlarged view of a configuration of a display device. In FIG. 1, some parts may be omitted or briefly illustrated. The pixel spacing in FIG. 2, may not exactly match that in FIG. 1. For example, in FIG. 2, the pixel spacing may be shown to be narrower than the pixel spacing in FIG. 1. This is intended for efficiency of illustration of the drawings.

Referring to FIGS. 1 and 2, the display device 1000 according to the first embodiment of the present disclosure may include a first substrate 100 including a first electrode 120, a second substrate 200 disposed on the first substrate 100 and including a connection wire 220 defining a plurality of individual pixel regions, a connection electrode 300 connecting the first electrode 120 to the connection wire 220, and a light emitting element 400 connected to the connection wire 200.

The first electrode 120 may be disposed on a first surface 101 positioned on a substrate body 110. The first surface 101 may be at a lower position than a top surface 103 of the substrate body 110. That is, for example, there may be a difference in height between the first surface 101 the top surface 103 as large as the thickness of the first electrode 120. Here, the height may refer to a height configured when the display device is placed in the state of FIGS. 1 and 2. In some cases, other terms such as depth and width may be used in place of height.

A second electrode 130 may be disposed on a second surface 102 of the first substrate 100. The second electrode 130 may be electrically connected to the first electrode 120. The second surface 102 on which the second electrode 130 is disposed may be a surface facing in a direction opposite to the direction in which the first surface 101 faces. The height of the second surface 102 may be greater than that of a bottom surface 104 of the substrate body 110. That is, for example, there may be a difference in height between the second surface 102 and the bottom surface 104 as large as the thickness of the second electrode 130.

The second electrode 130 may be electrically connected to the first electrode 120 by a third electrode 140. The second electrode 130 may correspond to a pad electrode of the display device 1000. For example, the second electrode 130 may be an electrode connected to a driving power unit (not shown) of the display device 1000.

In some cases, the second electrode 130 may be arranged to protrude downward from the bottom surface 104. Accordingly, it may be easily connected to the driving power unit. However, the second electrode 130 is not limited thereto. That is, the outer surface of the second electrode 130 may be at the same height as the bottom surface 104.

The third electrode 140 may be a through electrode arranged through the substrate body 110 to connect the first electrode 120 and the second electrode 130 to each other.

For example, the substrate body 110 may be a printed circuit board (PCB). That is, the first electrode 120 and the second electrode 130 may be electrodes printed on the PCB. The third electrode 140 may be arranged through the PCB.

Referring to FIG. 2, at least a portion of the first electrode 120 may be exposed at an end portion of the first substrate 100. That is, the first electrode 120 may be arranged on the first surface 101 of the substrate body 110 such that an end portion thereof reaches an edge of the substrate body 110. In addition, an opposite end portion of the first electrode 120 may be connected to the third electrode 140.

The third electrode 140 may be arranged to substantially extend through the substrate body 110 in a vertical direction. In addition, one end portion of the second electrode 130 may be connected to the third electrode 140 on the side of the bottom surface 104 of the first substrate 100. In this case, the opposite end portion of the second electrode 130 may face away from the first electrode 120. That is, the second electrode 130 may be arranged to extend by a predetermined length from a point where it is connected to the third electrode 140 toward an opposite side of the edge of the substrate body 110.

The second substrate 200 may be disposed on the top surface 103 of the first substrate 100. The second substrate 200 may be disposed on the first substrate 100 to have an exposure portion 500 that exposes at least a portion of the first electrode 120 of the first substrate 100.

The second substrate 200 may have a flexible substrate as a base body. That is, a connection wire 220 defining a plurality of individual pixel regions may be provided on the substrate base body 210, which is a flexible substrate.

In this case, the flexible substrate may be formed of a resin material such as polyimide (PI). That is, the substrate base body 210 of the second substrate 200 may be a resin substrate. Here, the base body is not limited to a specific resin material.

As described above, the second substrate 200 may be formed as a resin substrate, and accordingly the thickness thereof is controllable. For example, the thickness of the second substrate 200 may be less than that of the first substrate 100. Specifically, the thickness of the second substrate 200 may be less than that of the first substrate 100 by several μm to several tens of μm. Accordingly, the second substrate 200 may be advantageous in manufacturing a flexible display.

The second substrate 200 may be attached to the first substrate 100 by an adhesive layer 230. However, in some cases, the second substrate 200 may be directly formed on the first substrate 100.

As shown in FIG. 2, the connection wire 220 defining individual pixel regions may be formed in a grid shape on the substrate base body 210. Here, the individual pixels may substantially mean sub-pixels. For example, three sub-pixels may be grouped to form one pixel. For example, in FIG. 2, three light emitting elements 410, 420, and 430 may be red, green, and blue light emitting elements, respectively. Each of the light emitting elements may constitute a sub-pixel, and the three light emitting elements 410, 420, and 430 may constitute one pixel.

In this case, in FIG. 2, a connection wire 221 (hereinafter, referred to as a first connection wire) arranged in one direction may be a pixel electrode (or a data electrode), and a connection line 222 (hereinafter, referred to as a second connection wire) arranged in another direction may be a common electrode, or vice versa.

As described above, sub-pixels may be defined at points where the first connection wires 221 and the second connection wires 222 cross each other.

When the first connection wire 221 is a pixel electrode (or a data electrode), the first connection wire 221 may include a thin film transistor (TFT). Accordingly, the light emitting elements 410, 420, and 430 may be driven by the switching operation by the TFT. This configuration will be described in more detail below with reference to FIG. 3.

As mentioned above, when the second substrate 200 is disposed on the first substrate 100, the exposure portion 500 allowing at least a portion of the first electrode 120 to be exposed may be disposed. The exposure portion 500 may be disposed at an end portion of the second substrate 200.

For example, the width of the second substrate 200 may be less than that of the first substrate 100. Accordingly, when the second substrate 200 is disposed on the first substrate 100, the first substrate 100 may not be fully covered by the second substrate 200, but may have an exposed portion (W1 in FIG. 2). As described above, the exposure portion 500 may be formed on the portion of the first substrate 100 that is not covered by the second substrate 200.

The exposure portion 500 may include a first exposure portion 510 exposing an end portion of the first electrode 120 and a second exposure portion 520 exposing an end portion of the substrate body 110 of the first substrate 100.

A connection electrode 300 connecting the first electrode 120 of the first substrate 100 to the connection wire 220 of the second substrate may be provided to a portion including the first exposure portion 510.

That is, the connection electrode 300 may contact the exposure portion 500 to electrically connect the first electrode 120 of the first substrate 100 to the connection wire 220 of the second substrate 200.

The connection electrode 300 may electrically connect the connection wire 220 of the first electrode 120 to the second substrate 200 using a conductive material such as Ag, Cu, or Al.

In this case, the connection electrode 300 may be formed using a printing technique such as a screen, a pad, an inkjet, an EHD, an aerosol jet, or dispensing.

Specifically, referring to FIG. 1, the connection electrode 300 may connect an end portion of the first connection wire 221 to an end portion of the first electrode 120 of the first substrate 100 exposed by the first exposure portion 510. Accordingly, the connection electrode 300 is locally disposed at the end portions of the multiple first connection wires 221.

Multiple light emitting elements 400 (410, 420, and 430) may be disposed on and electrically connected to the connection wire 220 to form individual pixels. The light emitting elements 400 may include a red light emitting element 410, a green light emitting element 420, and a blue light emitting element 430. The three light emitting elements 410, 420, and 430 may form individual pixels and be repeatedly disposed on the second substrate 200. The light emitting element may include at least one of an organic light emitting element and an inorganic light emitting element. Specifically, it may be an inorganic semiconductor Light Emitting Diode (LED).

The unit (individual) semiconductor LED 400 may have a dimension in units of micrometers (μm). The dimension in micrometers (μm) may mean that the width of at least one surface of the light emitting element 100 is several to hundreds of micrometers (μm).

Figure 3:
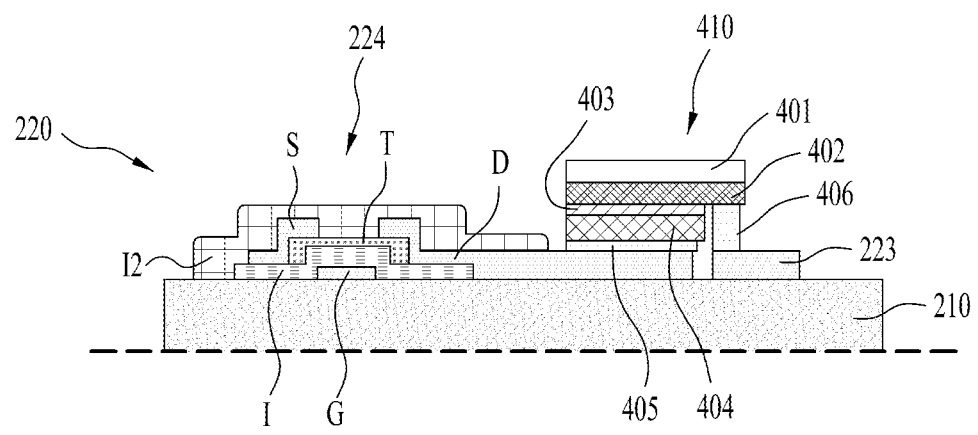
FIG. 3 is a partial cross-sectional view illustrating a connection wire of the display device according to the first embodiment of the present disclosure.

FIG. 3 is a partial cross-sectional view illustrating a connection wire of the display device according to the first embodiment of the present disclosure.

FIG. 3 illustrates an example case where the connection wire 220 includes a thin film transistor (TFT) 224. As mentioned above, the substrate base body 210 of the second substrate 200 may be a resin substrate, and the TFT 224 may be arranged in each individual sub-pixel region on the substrate base body 210.

As described above, the connection wire 220 may include the TFT 224. The TFT 224 may be configured by disposing a gate electrode G and an insulating layer I on the substrate base body 210, disposing a semiconductor layer T on the insulating layer, and disposing a source electrode S and a drain electrode D at both sides of the semiconductor layer T. The source electrode S and the drain electrode D may be coated with a second insulating layer 12.

In this case, the drain electrode D may be electrically connected to a first electrode 405 of the light emitting element 410. Also, a second electrode 406 of the light emitting element 410 may be connected to the third connection wire 223. In some cases, the third connection wire 223 may be identical to the second connection wire 222. In addition, the TFT 224 including the drain electrode D may be viewed as a component included in the first connection wire 221.

Here, the red light emitting element 410 is presented as an example of the light emitting element 410. However, it should be noted that the connection with the TFT and the structure of the light emitting element described herein may be equally applied to the other light emitting elements, for example, the green light emitting element 420 and the blue light emitting element 430.

FIG. 3 illustrates an example in which the light emitting element 410 is flip-chip bonded as a horizontal light emitting element. That is, the horizontal light emitting element may be configured by sequentially disposing a first conductive (e.g., n-type) semiconductor layer 402, an active layer 403, and a second conductive (e.g., p-type) semiconductor layer 404 on a substrate 401. The light emitting element 410 is connected to the drain electrode D and the third connection wire 223 in an inverted state.

The first electrode 405 is disposed on the second conductive semiconductor layer 404, and the second electrode 406 is disposed on a portion of the first conductive semiconductor layer 402 that is partially exposed.

As the light emitting element 410, a vertical light emitting element may be employed in addition to the horizontal light emitting element.

Figure 4:
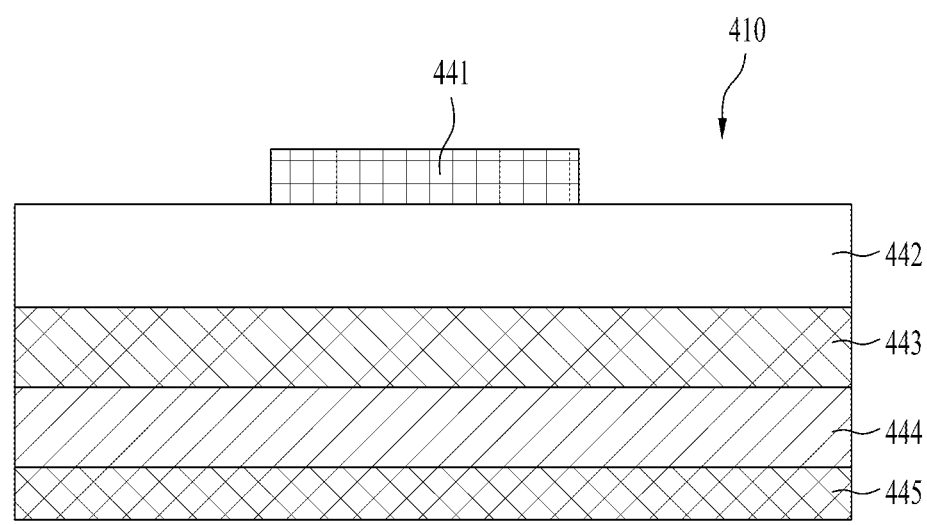
FIG. 4 is a cross-sectional view schematically showing an exemplary vertical light emitting element applicable to the display device according to the first embodiment of the present disclosure.

FIG. 4 is a cross-sectional view schematically showing an exemplary vertical light emitting element applicable to the display device according to the first embodiment of the present disclosure.

Referring to FIG. 4, the vertical light emitting element 410 may be configured by sequentially disposing a first conductive (e.g., p-type) semiconductor layer 444, an active layer 443, and a second conductive (e.g., n-type) semiconductor layer 442 on the first electrode 445. A second electrode 441 may be disposed on the second conductive semiconductor layer 442.

In the vertical light emitting element 410, electric current may flow from the first electrode 445 to the second electrode 441 in a vertical direction. Accordingly, when the vertical light emitting element 410 is employed, the first electrode 445 may be connected to the drain electrode D of the TFT 224, and the second electrode 441 may be connected to the third connection wire 223.

Figure 5:
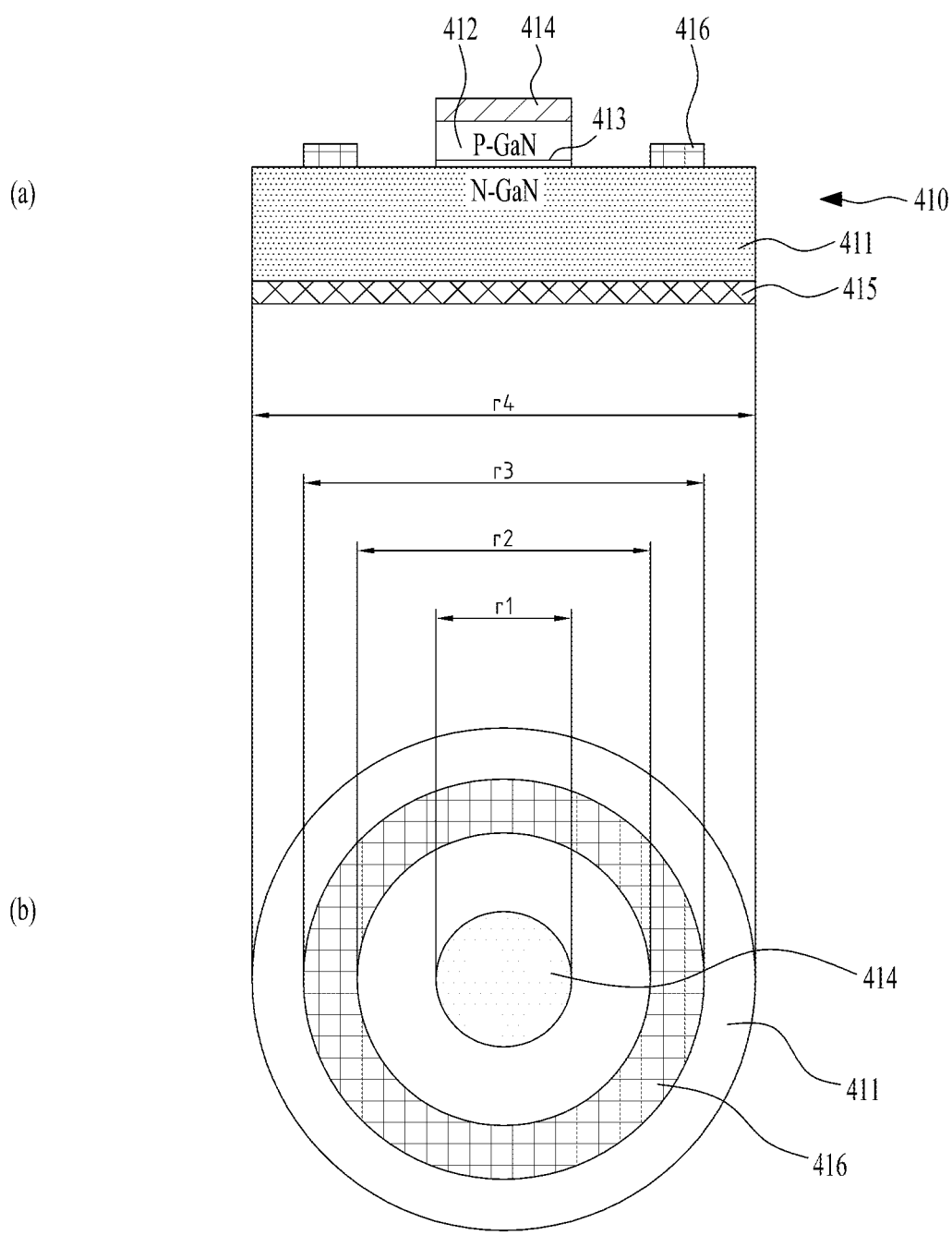
FIG. 5 is a cross-sectional view schematically showing another exemplary vertical light emitting element applicable to the display device according to the first embodiment of the present disclosure.

FIG. 5 is a cross-sectional view schematically showing another exemplary vertical light emitting element applicable to the display device according to the first embodiment of the present disclosure.

As mentioned above, the light emitting element (or LED) 410 may have a dimension in units of micrometers ($\mu$m). In the case of the micro LED 400 having a dimension in units of micrometers, the vertical light emitting element 410 may specifically have a structure as shown in FIG. 5. For example, the vertical light emitting element 410 may have a structure having a circular cross section.

In the light emitting element 410, an n-electrode 415 may be disposed at the bottom side, and a p-type gallium nitride (GaN)-based semiconductor layer (P-GaN) 412 may be disposed on an n-type gallium nitride (GaN)-based semiconductor layer (N-GaN) 411. In this case, an active layer 413 may be disposed between the n-type GaN-based semiconductor layer 411 and the p-type GaN-based semiconductor layer 412.

Also, a p-electrode 414 may be disposed on the p-type GaN-based semiconductor layer 412, and a magnetic member 416 may be disposed at the top of both sides of the n-type GaN-based semiconductor layer 411.

For example, in the case of a micro LED, in order to connect LEDs at individual sub-pixel positions, a magnetic method using a magnetic member may be used. That is, the individual light emitting elements 410 may be connected at pixel positions defining sub-pixels, using a magnetic force. To this end, the light emitting element 410 may include a magnetic member 416.

In the following description, the description of a method of installing a micro LED using a magnetic force or a detailed structure thereof will be skipped.

Referring back to FIGS. 1 and 2, the connection electrode 300 may connect an end portion of the first connection wire 221 to an end portion of the first electrode 120 of the first substrate 100 exposed by the first exposure portion 510. Accordingly, the connection electrode 300 is locally disposed on the end portions of the multiple first connection wires 221.

In other words, the connection electrode 300 may not be exposed at the end side of the first substrate 100. In addition, the first electrode 120 and the second electrode 130 may be printed on a PCB, and the first electrode 120 and the second electrode 130 may be connected by the third electrode 140 arranged through the PCB.

Accordingly, according to the first embodiment of the present disclosure, there is no electrode exposed to the outside at the edge of the first substrate 100 and/or the display device is manufactured using the PCB. Accordingly, damage to the substrates 100 and 200 and the electrodes 120, 130, 140, 220, and 300 may be prevented in implementing the display device.

In addition, when a high-resolution display device having pixels with a narrow pitch is manufactured, the connection electrode 300 may be locally configured using the exposure portion 500. Accordingly, a display with a narrow bezel, a so-called zero bezel display may be effectively manufactured. In addition, a space-efficient and design-efficient high-resolution display may be implemented. Therefore, a large-area high-resolution zero bezel display may be manufactured.

As described above, efficient wire connection may be implemented and damage to the electrodes and the substrates may be prevented. Accordingly, the reliability and quality of the display device may be improved.

FIGS. 6 to 14 are views illustrating a process of manufacturing the display device according to the first embodiment of the present disclosure. In particular, FIGS. 6, 7, 9, 11, and 13 are perspective views illustrating a process of manufacturing the display device according to the first embodiment of the present disclosure, and FIGS. 8, 10, 12, and 14 are cross-sectional views illustrating related parts.

Hereinafter, a process of manufacturing the display device according to the first embodiment of the present disclosure will be described with reference to FIGS. 6 to 14. For the parts not described herein, description of the corresponding parts described above with reference to FIGS. 1 to 5 may be applied.

Figure 6:
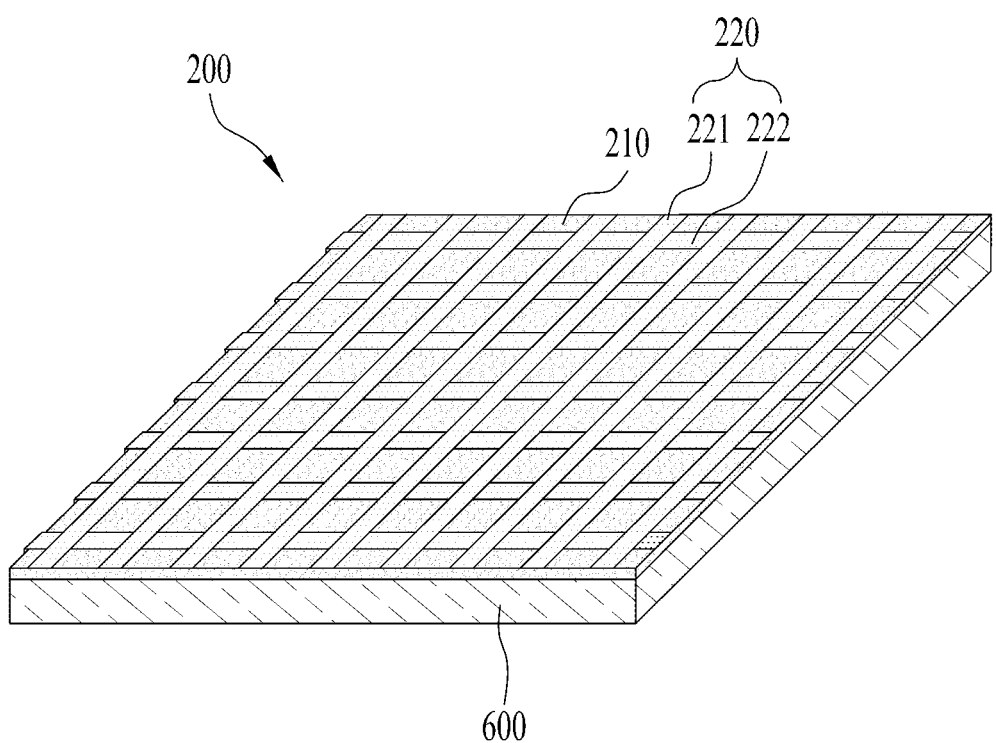
FIGS. 6 to 14 are views illustrating a process of manufacturing the display device according to the first embodiment of the present disclosure.

Referring to FIG. 6, the second substrate 200 may be formed on a base substrate 600. Here, the base substrate 600 is a substrate used to fabricate the second substrate 200. For example, it may be a glass substrate.

That is, the substrate base body 210 may be attached to or formed on the base substrate 600 including the glass substrate, using a resin material, and the connection wire 220 may be formed on the substrate base body 210.

The second substrate 200 may have a flexible substrate as a base body and may be formed of a resin material such as polyimide (PI).

As described above, the connection wire 220 may define multiple individual pixel regions. In FIG. 6, the connection wire 221 (hereinafter, referred to as a first connection wire) arranged in one direction may be a pixel electrode (or a data electrode), and the connection line 222 (hereinafter, referred to as a second connection wire) arranged in another direction may be a common electrode.

As described above, sub-pixels may be defined at points where the first connection wires 221 and the second connection wires 222 cross each other.

When the first connection wire 221 is a pixel electrode (or a data electrode), the first connection wire 221 may include a thin film transistor (TFT). A detailed description thereof will be omitted.

Figure 7:
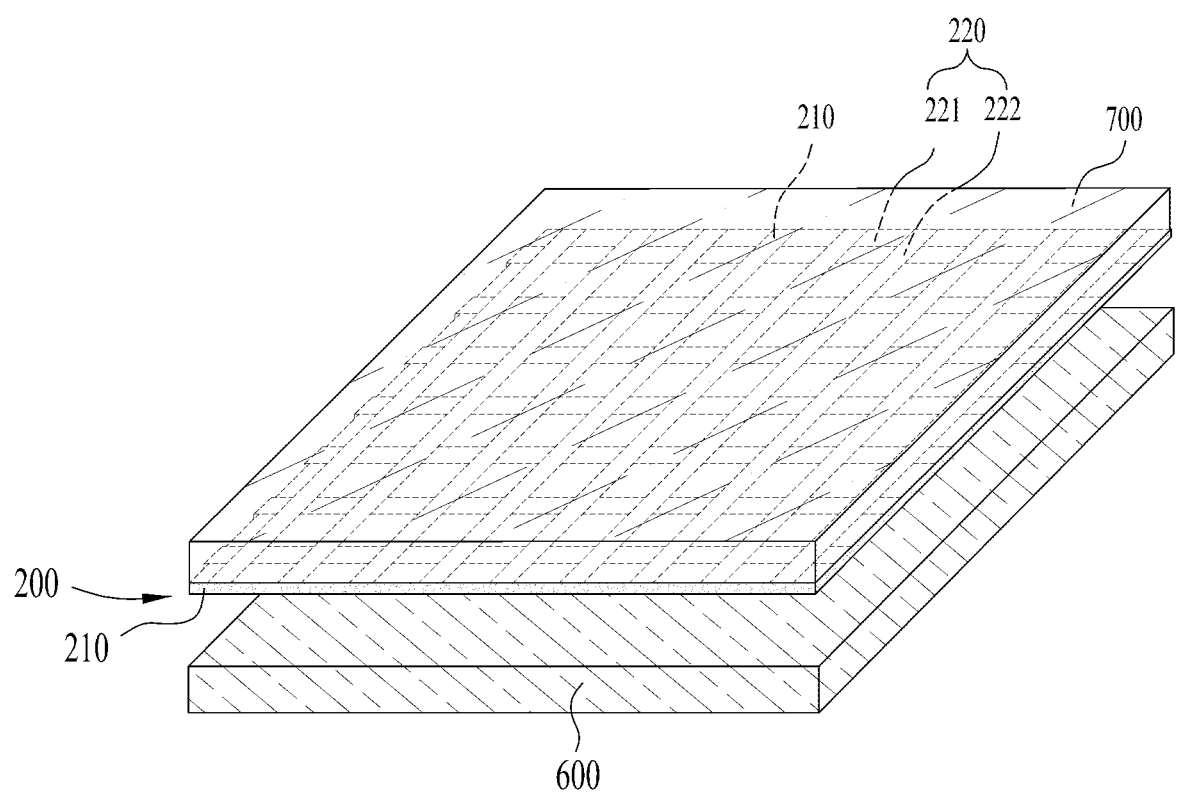
Figure 8:
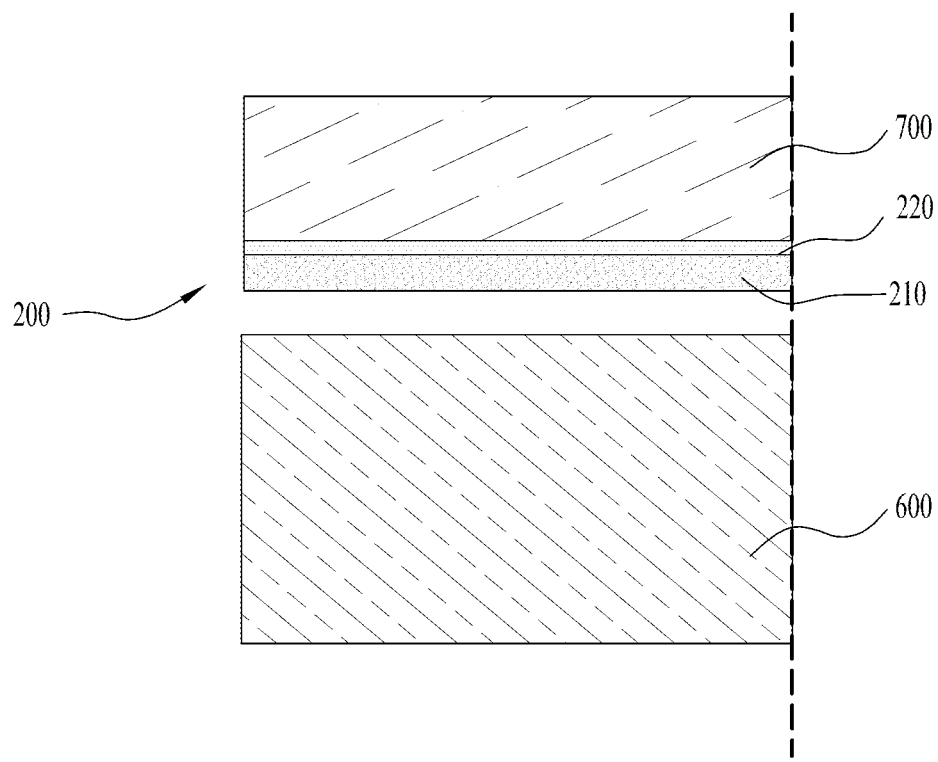

Referring to FIGS. 7 and 8, a transfer substrate 700 may be attached to the second substrate 200. Next, the second substrate 200 may be separated from the base substrate 600. The second substrate 200 may be separated using a laser. That is, the interfaces between the base substrate 600 and the second substrate 200 may be separated by radiating a laser from a side of the base substrate 600 including the glass substrate or the transfer substrate 700.

Figure 9:
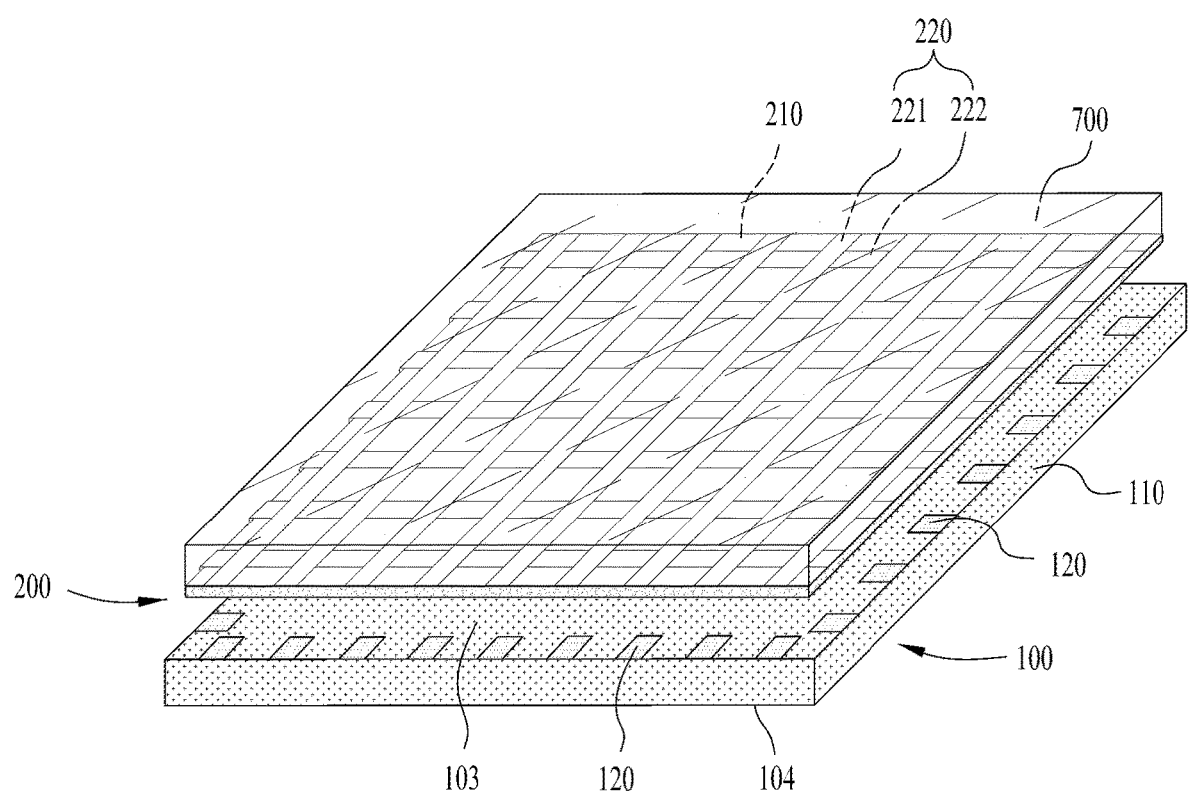
Figure 10:
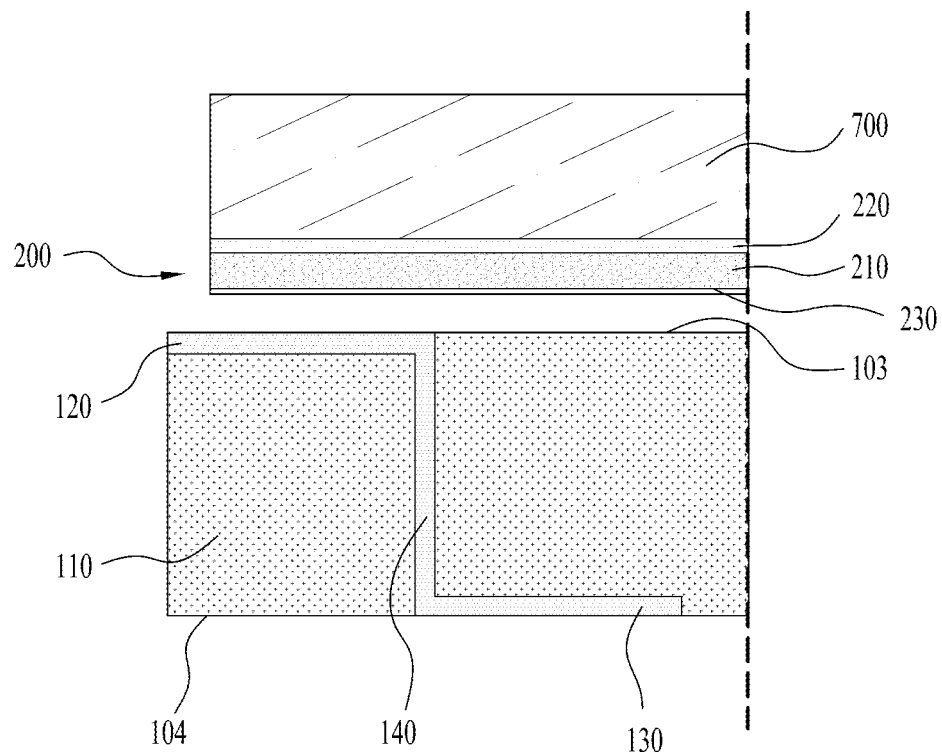

Next, referring to FIGS. 9 and 10, the second substrate 200 manufactured as described above may be attached to the first substrate 100.

Here, the first substrate 100 may include a first electrode 120, a second electrode 130, and a third electrode 140, as described above.

That is, the first electrode 120 may be disposed on a first surface 101 positioned on the substrate body 110. Also, the second electrode 130 may be disposed on a second surface 102 of the first substrate 100. The second electrode 130 may be electrically connected to the first electrode 120.

The second electrode 130 may be electrically connected to the first electrode 120 by the third electrode 140. The second electrode 130 may correspond to a pad electrode of the display device 1000. For example, the second electrode 130 may be an electrode connected to a driving power unit (not shown) of the display device 1000.

The third electrode 140 may be a through electrode arranged through the substrate body 110 to connect the first electrode 120 and the second electrode 130 to each other.

For example, the substrate body 110 may be a printed circuit board (PCB). That is, the first electrode 120 and the second electrode 130 may be electrodes printed on the PCB. The third electrode 140 may be arranged through the PCB.

The first substrate 100 may be the same as that described above with reference to FIGS. 1 and 2. Before the second substrate 200 is attached, the first substrate 100 having such a structure may be pre-manufactured. That is, the first substrate 100 may be pre-manufactured by forming the first electrode 120, the second electrode 130, and the third electrode 140 on the PCB.

As shown in FIG. 9, at least a portion of the first electrode 120 may be exposed at an end portion of the first substrate 100. That is, the first electrode 120 may be arranged on the substrate body 110 such that an end portion thereof reaches an edge of the substrate body 110.

The first substrate 100 and the second substrate 200 may be adhered by forming an adhesive layer on the opposite surface of at least one of the first substrate 100 and the second substrate 200.

Figure 11:
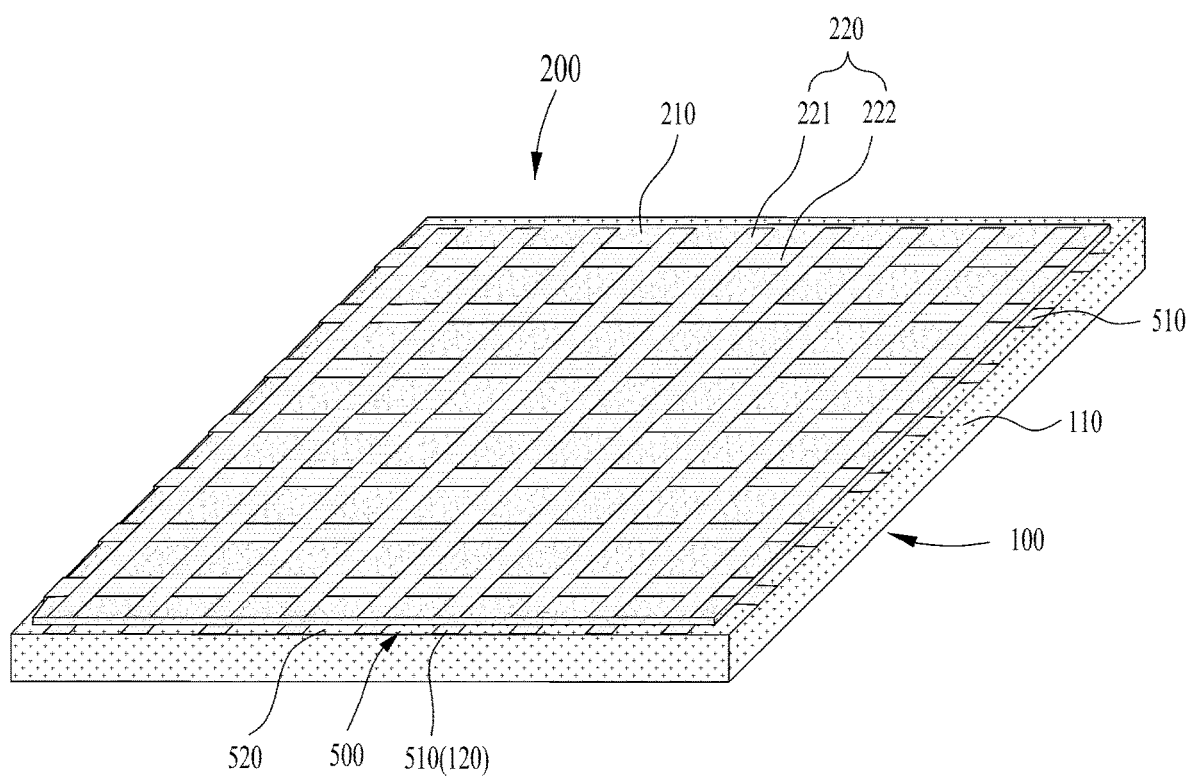
Figure 12:
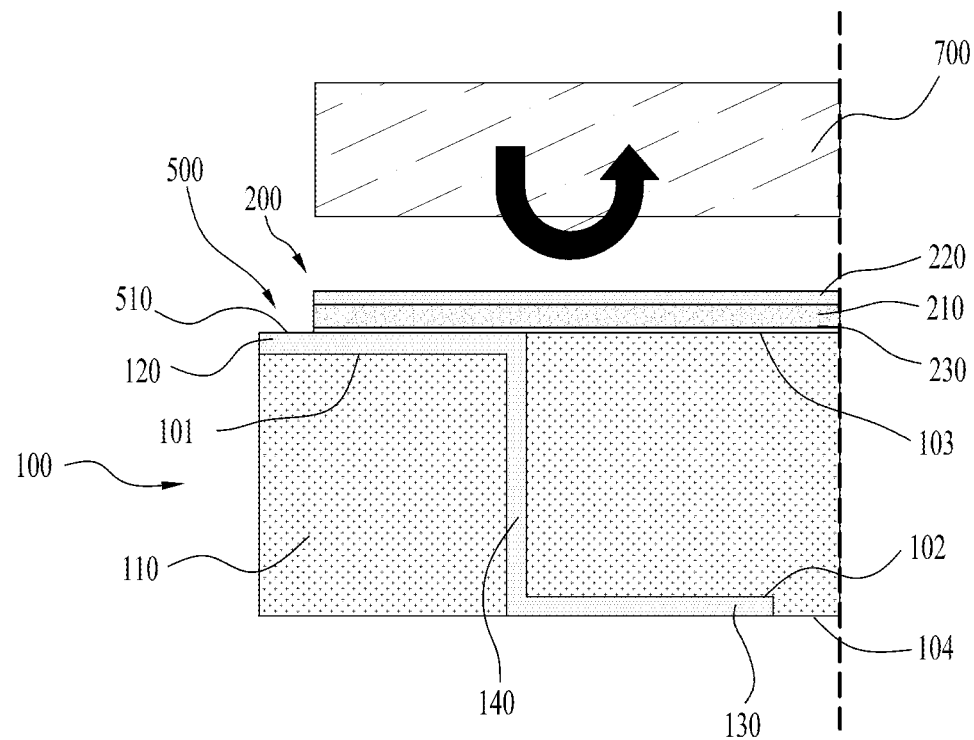

Referring to FIGS. 11 and 12, the transfer substrate 700 may be separated after the first substrate 100 and the second substrate 200 are attached. That is, when the transfer substrate 700 is separated as shown in FIG. 12, the arrangement shown in FIG. 11 may be obtained.

In this case, the second substrate 200 may be attached to the first substrate 100 to have an exposure portion 500 exposing at least a portion of the first electrode 120 disposed at an edge of the first substrate 100.

As shown in the figure, the width of the second substrate 200 may be less than that of the first substrate 100. Accordingly, when the second substrate 200 is disposed on the first substrate 100, the first substrate 100 may not be fully covered by the second substrate 200, but may have an exposed portion. As described above, the exposure portion 500 may be formed on the portion of the first substrate 100 that is not covered by the second substrate 200.

The exposure portion 500 may include a first exposure portion 510 exposing an end portion of the first electrode 120 and a second exposure portion 520 exposing an end portion of the substrate body 110 of the first substrate 100. In FIG. 11, the exposed portion of the first electrode 120 may be identical to the first exposure portion 510.

Figure 13:
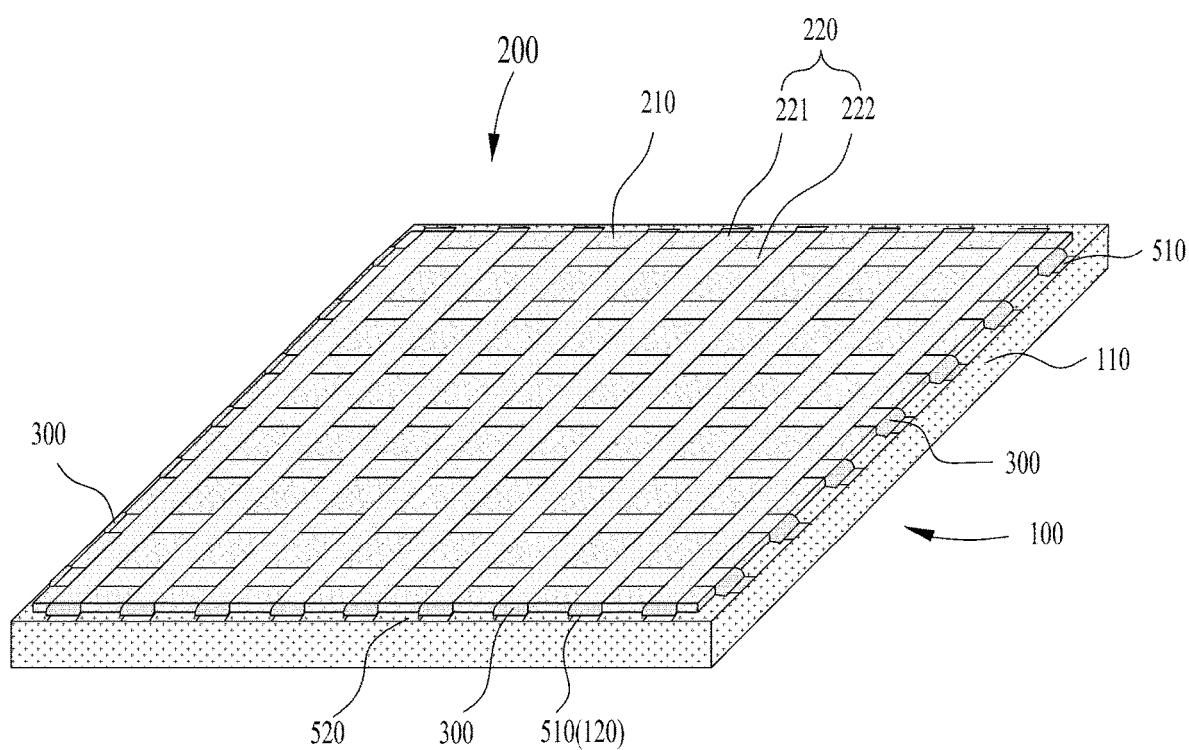
Figure 14:
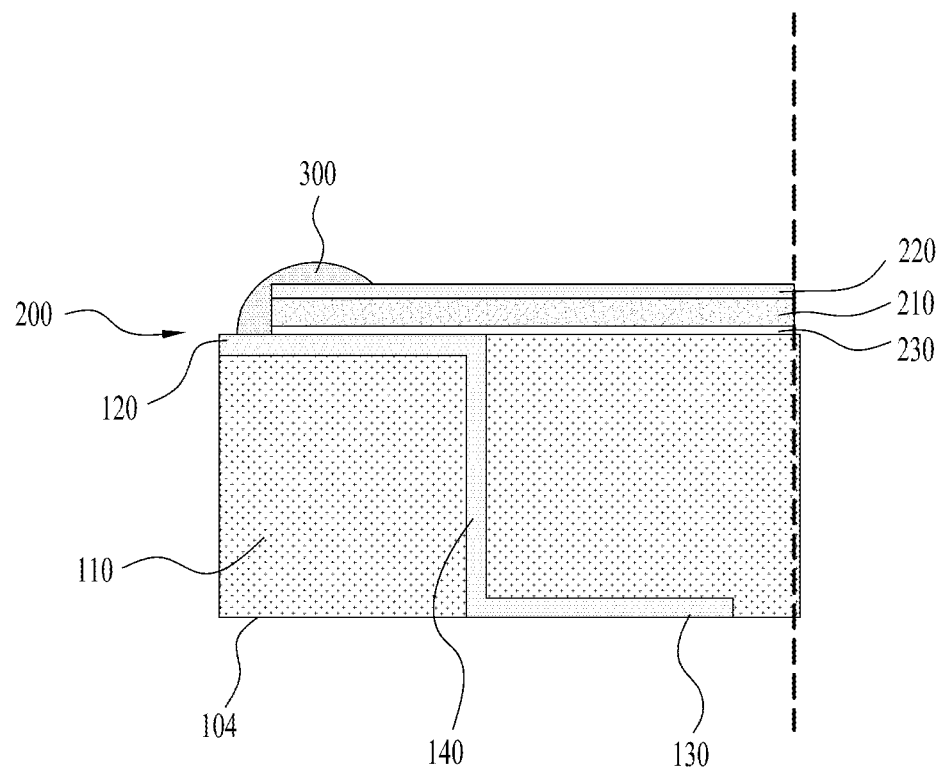

Next, referring to FIGS. 13 and 14, a connection electrode 300 connecting the first electrode 120 of the first substrate 100 to the connection wire 220 of the second substrate may be formed on a portion including the first exposure portion 510.

The connection electrode 300 may contact the exposure portion 500 to electrically connect the first electrode 120 of the first substrate 100 to the connection wire 220 of the second substrate 200.

The connection electrode 300 may electrically connect the connection wire 220 of the first electrode 120 to the second substrate 200 using a conductive material such as Ag, Cu, or Al.

In this case, the connection electrode 300 may be formed using a printing technique such as a screen, a pad, an inkjet, an EHD, an aerosol jet, or dispensing.

Specifically, the connection electrode 300 may connect an end portion of the first connection wire 221 to an end portion of the first electrode 120 of the first substrate 100 exposed by the first exposure portion 510. Accordingly, the connection electrode 300 is locally disposed at the end portions of the multiple first connection wires 221.

Multiple light emitting elements 400 (410, 420, and 430) may be disposed on and electrically connected to the connection wire 220 to form individual pixels. Then, the arrangements shown in FIGS. 1 and 2 described above may be obtained.

The light emitting elements 400 may include a red light emitting element 410, a green light emitting element 420, and a blue light emitting element 430. The three light emitting elements 410, 420, and 430 may form individual pixels and be repeatedly disposed on the second substrate 200.

The light emitting element 400 may be arranged to be electrically connected to the connection wire 220 in various ways. As an example, multiple light emitting elements 400 may be connected simultaneously or step by step using a method based on a magnet, as mentioned above.

Accordingly, in some cases, multiple light emitting elements 400 may be attached to the first substrate 100 such that they are arranged on the connection wire 220 of the second substrate 200. That is, the connection electrode 300 may be formed after the light emitting elements 400 are attached to the first substrate 100 while being connected to the connection wire 220.

Figure 15:
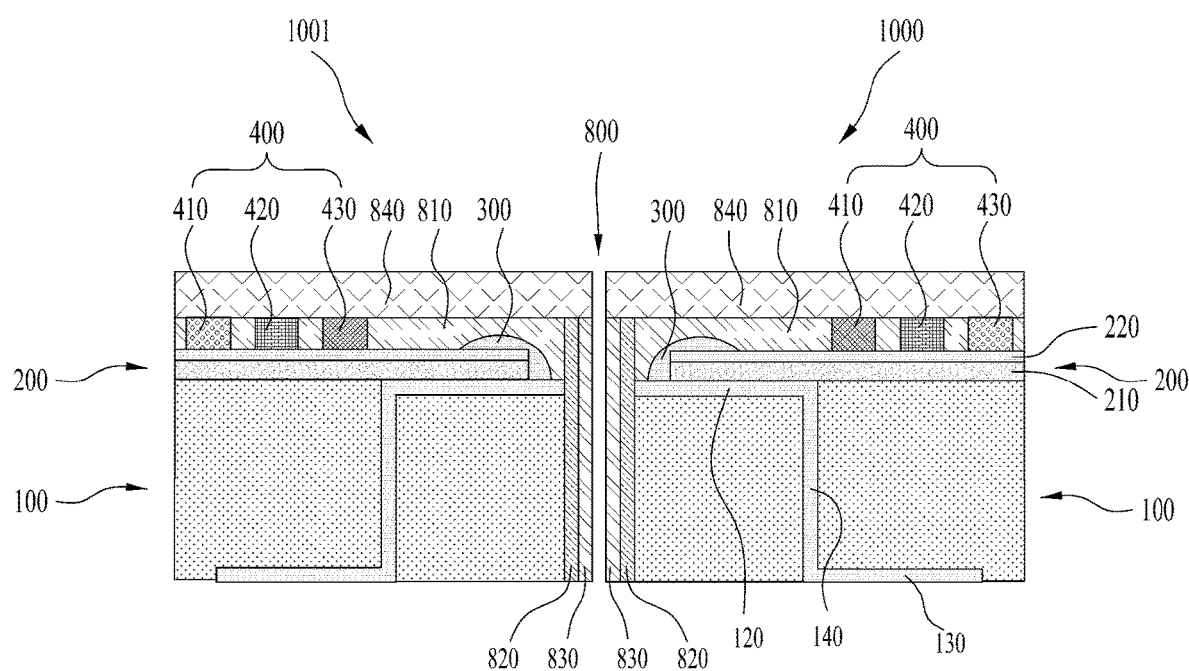
FIG. 15 is a cross-sectional view showing a module-type display device according to the first embodiment of the present disclosure.

FIG. 15 is a cross-sectional view showing a module-type display device according to the first embodiment of the present disclosure. The module-type display device may be configured by bonding the display devices having the configurations of FIGS. 1 and 2 to each other.

FIG. 15 shows two display devices 1000 and 1001 attached to each other as modules. However, more than two display modules may be attached to each other to form a tile-type display device. Thereby, a large-area display device may be effectively manufactured.

Referring to FIG. 15, in addition to the configuration described with reference to FIG. 2, each of the display modules 1000 and 1001 may further include a flattened layer 810 disposed on the second substrate 200. That is, a flattened layer 810 to cover the connection wire, the light emitting element 400, the connection electrode 300, and the exposed portion of the first electrode 120 may be formed on the top surface of the second substrate 200 on which the light emitting element 400 is arranged.

An optical film 840 such as a color filter may be disposed on the flattened layer 810. The optical film 840 may adjust the color of the pixel when the light emitting element 400 is turned on.

A protective layer 830 disposed at an edge side of the first substrate 100 and an end portion of the flattened layer 810 may be further provided. The protective layer 830 may protect the display structure when the display modules are bonded to each other.

A black matrix 820 may be disposed between the protective layer 830 and the edge side of the first substrate 100 and the end portion of the flattened layer 810. The black matrix 820 may improve the contrast of pixels.

As described above, the two display modules 1000 and 1001 may be bonded to each other on a bonding interface 800 such that the protective layers 830 faces each other. Thereby, a module-type display may be configured.

Referring to FIG. 15, it may be seen that the protective layers 830, the black matrices 820, and the substrate bodies 110 of the first substrates 100 are disposed at a portion where the two modules 1000 and 1001 contact each other. In this case, as described above, the substrate body 110 is a PCB. In addition, it may be seen that electrode elements such as the connection electrode 300 are not directly or indirectly exposed on the contact surface.

Accordingly, when the module-type display device is implemented, damage to the substrates 100 and 200 and the electrodes 120, 130, 140, and 220 may be prevented.

In addition, when a high-resolution display device having pixels with a narrow pitch is manufactured, the connection electrode 300 may be locally configured using the exposure portion 500. Thereby, a narrow bezel display, a so-called zero bezel display may be effectively manufactured. In addition, a space-efficient and design-efficient high-resolution display may be implemented. Accordingly, a large-area high-resolution zero-bezel display may be manufactured.

As described above, efficient wire connection may be implemented and damage to the electrodes and the substrates may be prevented. Accordingly, the reliability and quality of the display device may be improved.

Figure 16:
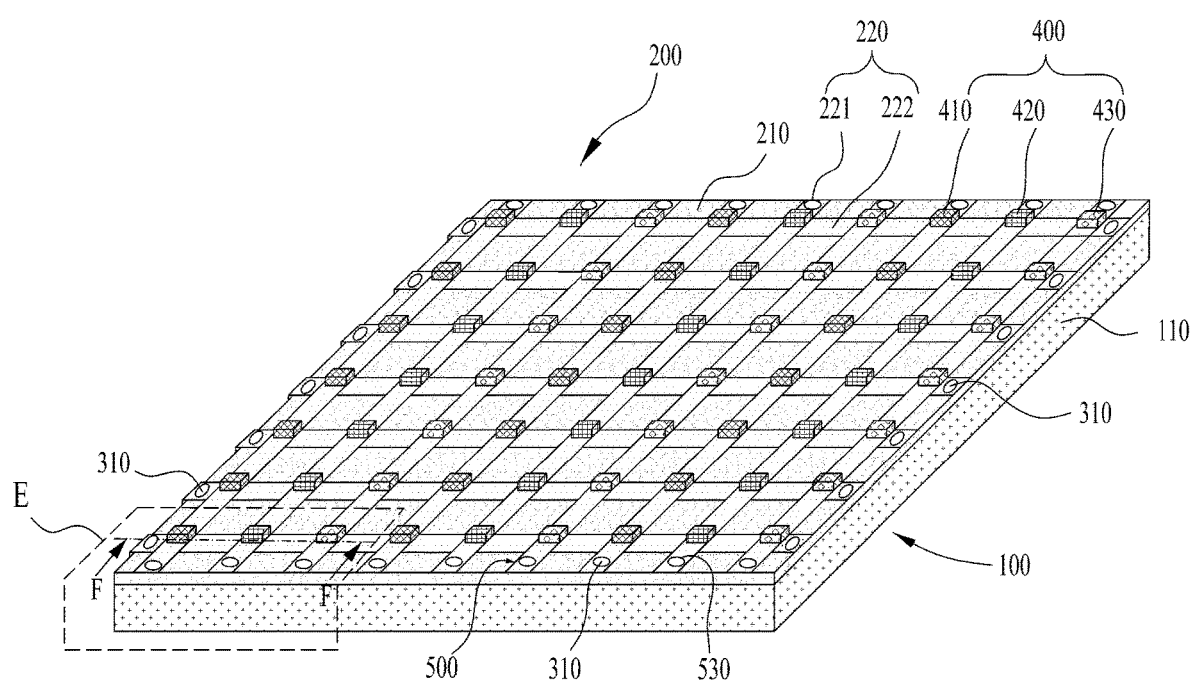
FIG. 16 is a perspective view showing a display device according to a second embodiment of the present disclosure.
Figure 17:
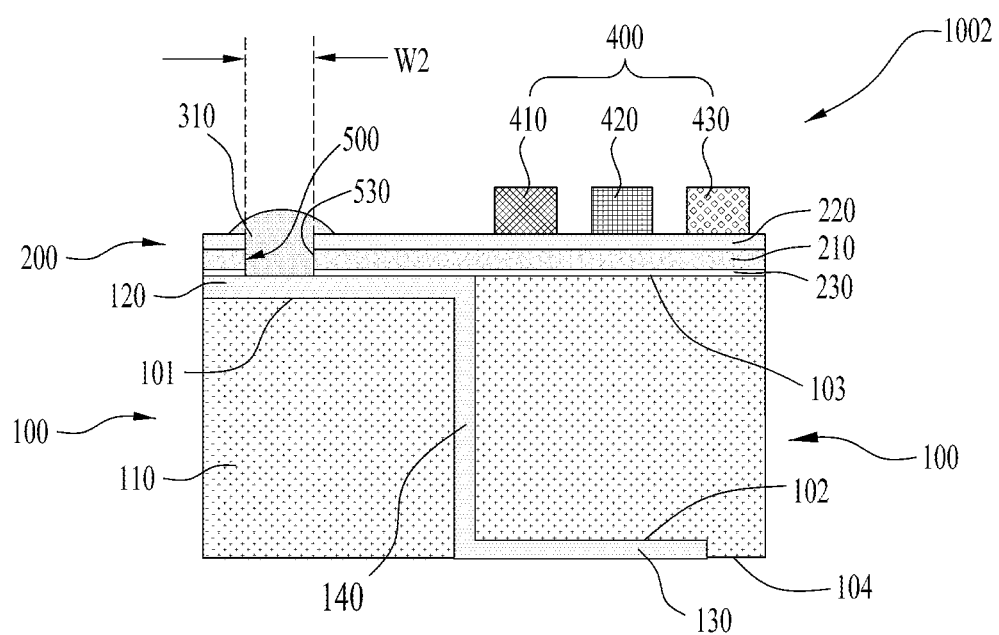
FIG. 17 is a cross-sectional view of part E, taken along ling F-F in FIG. 16.

FIG. 16 is a perspective view showing a display device according to a second embodiment of the present disclosure. FIG. 17 is a cross-sectional view of part E, taken along ling F-F in FIG. 16.

FIG. 16 is an enlarged view showing the configuration of the display device. In FIG. 16, some parts may be omitted or briefly illustrated. The pixel spacing in FIG. 17, may not exactly match that in FIG. 16. For example, in FIG. 17, the pixel spacing may be shown to be narrower than the pixel spacing in FIG. 16. This is intended for efficiency of illustration of the drawings.

Hereinafter, the display device according to the second embodiment of the present disclosure will be described in detail with reference to FIGS. 16 and 17. In this case, description of parts that are the same as those in the first embodiment of the present disclosure may be simplified or omitted. Therefore, in interpreting the present disclosure, it is apparent that the description of the first embodiment given above may be equally applied to the second embodiment described herein unless otherwise stated.

Referring to FIGS. 16 and 17, the display device 1002 according to the second embodiment of the present disclosure may include a first substrate 100 including a first electrode 120, a second substrate 200 disposed on the first substrate 100 and including a connection wire 220 defining a plurality of individual pixel regions, a connection electrode 300 connecting the first electrode 120 to the connection wire 220, and a light emitting element 400 connected to the connection wire 200.

The first electrode 120 may be disposed on a first surface 101 positioned on the substrate body 110. A second electrode 130 may be disposed on a second surface 102 of the first substrate 100. The second electrode 130 may be electrically connected to the first electrode 120.

The second electrode 130 may be electrically connected to the first electrode 120 by a third electrode 140. The second electrode 130 may correspond to a pad electrode of the display device 1000. For example, the second electrode 130 may be an electrode connected to a driving power unit (not shown) of the display device 1000.

The third electrode 140 may be a through electrode arranged through the substrate body 110 to connect the first electrode 120 and the second electrode 130 to each other.

For example, the substrate body 110 may be a printed circuit board (PCB). That is, the first electrode 120 and the second electrode 130 may be electrodes printed on the PCB. The third electrode 140 may be arranged through the PCB.

Referring to FIG. 17, at least a portion of the first electrode 120 may be exposed at an end portion of the first substrate 100. That is, the first electrode 120 may be arranged on the first surface 101 of the substrate body 110 such that an end portion thereof reaches an edge of the substrate body 110. In addition, an opposite end portion of the first electrode 120 may be connected to the third electrode 140.

The third electrode 140 may be arranged to substantially extend through the substrate body 110 in a vertical direction. In addition, one end portion of the second electrode 130 may be connected to the third electrode 140 on the side of the bottom surface 104 of the first substrate 100. In this case, the opposite end portion of the second electrode 130 may face away from the first electrode 120. That is, the second electrode 130 may be arranged to extend by a predetermined length from a point where it is connected to the third electrode 140 toward an opposite side of the edge of the substrate body 110.

The second substrate 200 may be disposed on the top surface 103 of the first substrate 100. The second substrate 200 may be disposed on the first substrate 100 to have an exposure portion 500 that exposes at least a portion of the first electrode 120 of the first substrate 100. The exposure portion 500 may be a through portion 530 disposed at an end portion of the second substrate 200.

The second substrate 200 may have a flexible substrate as a base body. That is, a connection wire 220 defining a plurality of individual pixel regions may be provided on the substrate base body 210, which is a flexible substrate.

In this case, the flexible substrate may be formed of a resin material such as polyimide (PI). That is, the substrate base body 210 of the second substrate 200 may be a resin substrate. Here, the base body is not limited to a specific resin material.

The thickness of the second substrate 200 may be less than that of the first substrate 100. Specifically, the thickness of the second substrate 200 may be less than that of the first substrate 100 by several μm to several tens of μm. Accordingly, the second substrate 200 may be advantageous in manufacturing a flexible display.

The second substrate 200 may be attached to the first substrate 100 by an adhesive layer 230. However, in some cases, the second substrate 200 may be directly formed on the first substrate 100.

As shown in FIG. 17, the connection wire 220 defining individual pixel regions may be formed in a grid shape on the substrate base body 210. Here, the individual pixels may substantially mean sub-pixels. For example, three sub-pixels may be grouped to form one pixel. For example, in FIG. 17, three light emitting elements 410, 420, and 430 may be red, green, and blue light emitting elements, respectively. Each of the light emitting elements may constitute a sub-pixel, and the three light emitting elements 410, 420, and 430 may constitute one pixel.

In this case, in FIG. 17, a connection wire 221 (hereinafter, referred to as a first connection wire) arranged in one direction may be a pixel electrode (or a data electrode), and a connection line 222 (hereinafter, referred to as a second connection wire) arranged in another direction may be a common electrode, or vice versa.

As described above, sub-pixels may be defined at points where the first connection wires 221 and the second connection wires 222 cross each other.

When the first connection wire 221 is a pixel electrode (or a data electrode), the first connection wire 221 may include a thin film transistor (TFT). Accordingly, the light emitting elements 410, 420, and 430 may be driven by the switching operation by the TFT. The details of the TFT and the light emitting element 400 may be the same as those described with reference to FIGS. 3 to 5.

As mentioned above, when the second substrate 200 is disposed on the first substrate 100, the exposure portion 500 allowing at least a portion of the first electrode 120 to be exposed may be disposed. The exposure portion 500 may be disposed at an end portion of the second substrate 200. A specific example of the exposure portion 500 may be the through portion 530.

In this case, the width of the second substrate 200 may be equal to that of the first substrate 100. Accordingly, when the second substrate 200 is disposed on the first substrate 100, the first substrate 100 may be substantially matched with the second substrate 200.

The through portion 530 may be formed through the entire second substrate 200. That is, the through portion 530 may be formed by penetrating all of the substrate base body 210, the connection wire 220, and the adhesive layer 230 such that a top portion of the first electrode 120 may be exposed by the through portion 530.

That is, the first substrate 100 may not be fully covered by the second substrate 200, but may have a portion (W2 of FIG. 17) exposed by the through portion 530. In this way, an exposure portion 500 through which the first substrate 100 is exposed rather than being fully covered by the second substrate 200 may be formed.

A connection electrode 310 connecting the first electrode 120 of the first substrate 100 to the connection wire 220 of the second substrate may be provided in a portion including the through portion 530.

That is, the connection electrode 310 may be disposed in the through portion 530 to contact the first electrode 120, and extend to the top of the connection wire 220 to electrically connect the first electrode 120 of the first substrate 100 to the connection wire 220 of the second substrate 200.

The connection electrode 310 may electrically connect the connection wire 220 of the first electrode 120 to the second substrate 200 using a conductive material such as Ag, Cu, or Al.

In this case, the connection electrode 310 may be formed using a printing technique such as a screen, a pad, an inkjet, an EHD, an aerosol jet, or dispensing.

Specifically, referring to FIG. 17, the connection electrode 310 is locally disposed at positions where the through portions 530 are provided at the end portions of the multiple first connection wires 221.

Multiple light emitting elements 400 (410, 420, and 430) may be disposed on and electrically connected to the connection wire 220 to form individual pixels. The light emitting elements 400 may include a red light emitting element 410, a green light emitting element 420, and a blue light emitting element 430. The three light emitting elements 410, 420, and 430 may form individual pixels and be repeatedly disposed on the second substrate 200. The light emitting element may include at least one of an organic light emitting element and an inorganic light emitting element. Specifically, it may be an inorganic semiconductor Light Emitting Diode (LED).

The unit (individual) semiconductor LED 400 may have a dimension in units of micrometers (μm). The dimension in micrometers (μm) may mean that the width of at least one surface of the light emitting element 100 is several to hundreds of micrometers (μm).

As described above, the connection electrode 310 may connect the end portion of the first connection wire 221 and the end portion of the first electrode 120 to each other through the through portion 530. Accordingly, the connection electrode 310 is locally disposed at the end portions of the multiple first connection wires 221

In other words, the connection electrode 310 may not be exposed at the end side of the first substrate 100. In addition, the first electrode 120 and the second electrode 130 may be printed on a PCB, and the first electrode 120 and the second electrode 130 may be connected by the third electrode 140 arranged through the PCB.

Accordingly, according to the second embodiment of the present disclosure, there is no electrode exposed to the outside at the edge of the first substrate 100 and/or the display device is manufactured using the PCB. Accordingly, damage to the substrates 100 and 200 and the electrodes 120, 130, 140, and 220 may be prevented in implementing the display device.

In addition, when a high-resolution display device having pixels with a narrow pitch is manufactured, the connection electrode 310 may be locally configured using the exposure portion 500 (the through portion 530). Accordingly, a display with a narrow bezel, a so-called zero bezel display may be effectively manufactured. In addition, a space-efficient and design-efficient high-resolution display may be implemented. Therefore, a large-area high-resolution zero bezel display may be manufactured.

As described above, efficient wire connection may be implemented and damage to the electrodes and the substrates may be prevented. Accordingly, the reliability and quality of the display device may be improved.

Figure 18:
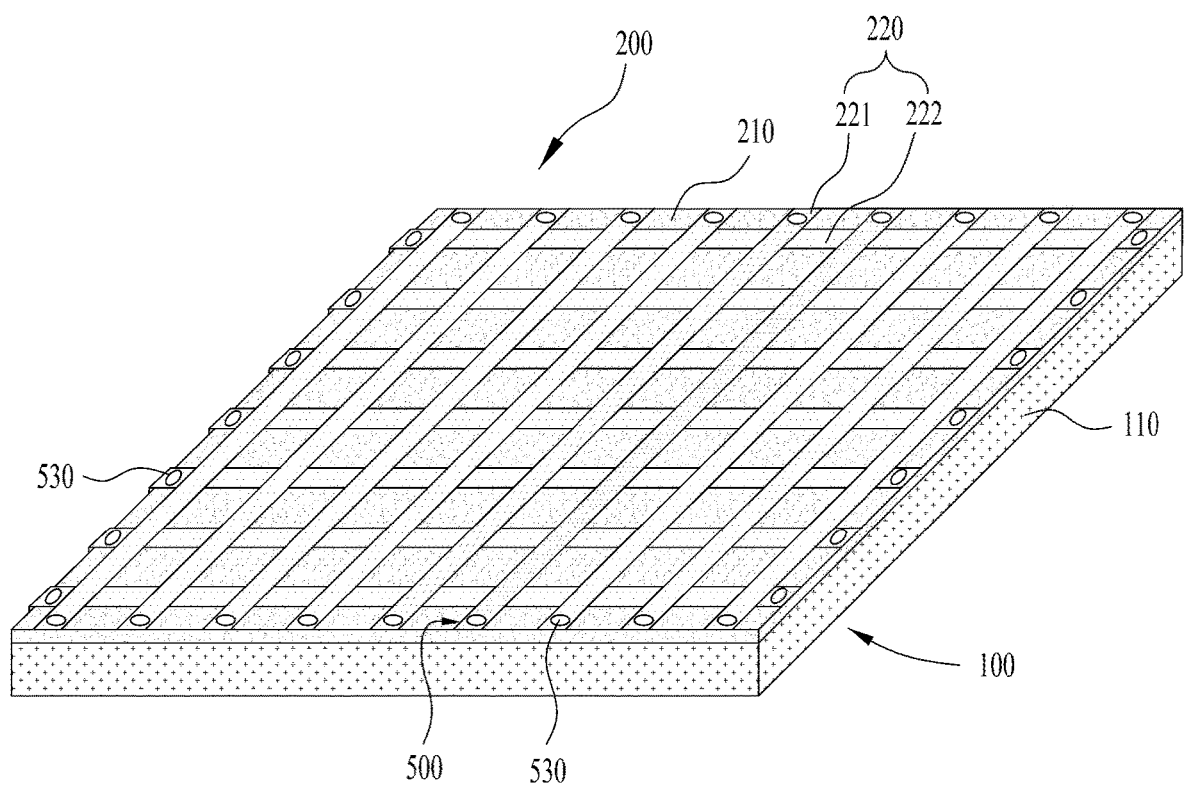
FIGS. 18 and 19 are perspective views illustrating a process of manufacturing the display device according to the second embodiment of the present disclosure.
Figure 19:
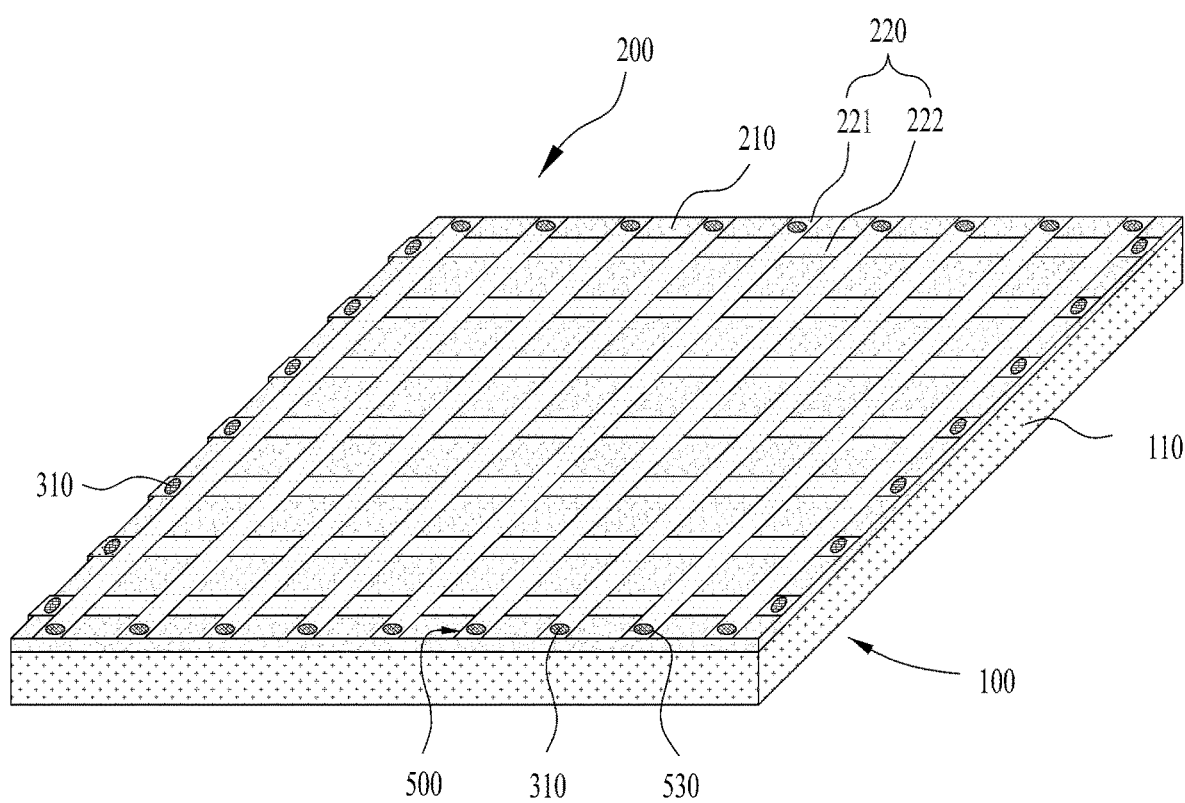

FIGS. 18 and 19 are perspective views illustrating a process of manufacturing the display device according to the second embodiment of the present disclosure.

Hereinafter, a process of manufacturing the display device according to the first embodiment of the present disclosure will be described with reference to FIGS. 18 and 19. For the parts not described herein, description of the corresponding parts described above with reference to FIGS. 16 and 17 may be applied.

In addition, the details described with reference to FIGS. 6 to 12 may be equally applied to the present embodiment.

However, in the description referring to FIGS. 9 to 12, descriptions related to the sizes of the first substrate 100 and the second substrate 200 may be different from those of the present embodiment. Accordingly, the configuration of the exposure portion 500 that may result from the difference in size between the first substrate 100 and the second substrate 200 may be different from that of the second embodiment.

Specifically, in the present embodiment, the sizes of the first substrate 100 and the second substrate 200 may be substantially the same. Accordingly, when the second substrate 200 is disposed on the first substrate 100, the second substrate 200 may be substantially matched with the first substrate 100.

However, in the present embodiment, details related to the sizes of the first substrate 100 and the second substrate 200 may be the same as those in the first embodiment described above. That is, even when an exposed portion is provided at the edge side of the first substrate 100 or the second substrate 200, the through portion 530 may be formed, and the connection electrode 310 may be formed using the through portion 530.

Hereinafter, a description of components described with reference to FIGS. 6 to 12 will be omitted, and a manufacturing process following the state shown in FIG. 11 will be described.

First, referring to FIG. 18, the size of the first substrate 100 is substantially equal to that of the second substrate 200, and accordingly there may not be an exposed portion at the edge side of the first substrate 100 or the second substrate 200.

Referring to FIG. 18, a through portion 530 formed through the entire second substrate 200 may be disposed at an end portion of the connection wire 220.

The through portion 530 may be formed before the first substrate 100 and the second substrate 200 are bonded to each other. This is because forming the through portion 530 with the first substrate 100 and the second substrate 200 bonded may result in damage to the first electrode 120.

The through portions 530 may be formed at both end portions of the first connection electrode 221 and both portions of the second connection electrode 222.

Next, referring to FIG. 19, a connection electrode 310 connecting the first electrode 120 of the first substrate 100 to the connection wire 220 of the second substrate may be provided to a portion provided with the through portion 530.

The connection electrode 310 may be disposed inside and outside the through portion 530 to electrically connect the first electrode 120 of the first substrate 100 to the connection wire 220 of the second substrate 200.

The connection electrode 310 may electrically connect the connection wire 220 of the first electrode 120 to the second substrate 200 using a conductive material such as Ag, Cu, or Al.

In this case, the connection electrode 310 may be formed using a printing technique such as a screen, a pad, an inkjet, an EHD, an aerosol jet, or dispensing.

In detail, the connection electrode 310 may extend to connect the first electrode 120 disposed at the position of the through portion 530 to a portion of the connection wire 220 disposed outside the through portion 530. In this case, the size of the portion of the connection electrode 310 disposed outside the through portion 530 may be larger than the size of the portion of the connection electrode 310 disposed inside the through portion 530. That is, a structure similar to a rivet may be formed.

Multiple light emitting elements 400 (410, 420, and 430) may be disposed on and electrically connected to the connection wire 220 to form individual pixels. Then, the arrangements shown in FIGS. 16 and 17 described above may be obtained.

The light emitting elements 400 may include a red light emitting element 410, a green light emitting element 420, and a blue light emitting element 430. The three light emitting elements 410, 420, and 430 may form individual pixels and be repeatedly disposed on the second substrate 200.

The light emitting element 400 may be arranged to be electrically connected to the connection wire 220 in various ways. As an example, multiple light emitting elements 400 may be connected simultaneously or step by step using a method based on a magnet, as mentioned above.

Accordingly, in some cases, multiple light emitting elements 400 may be attached to the first substrate 100 such that they are arranged on the connection wire 220 of the second substrate 200. That is, the connection electrode 310 may be formed after the light emitting elements 400 are attached to the first substrate 100 while being connected to the connection wire 220.

Figure 20:
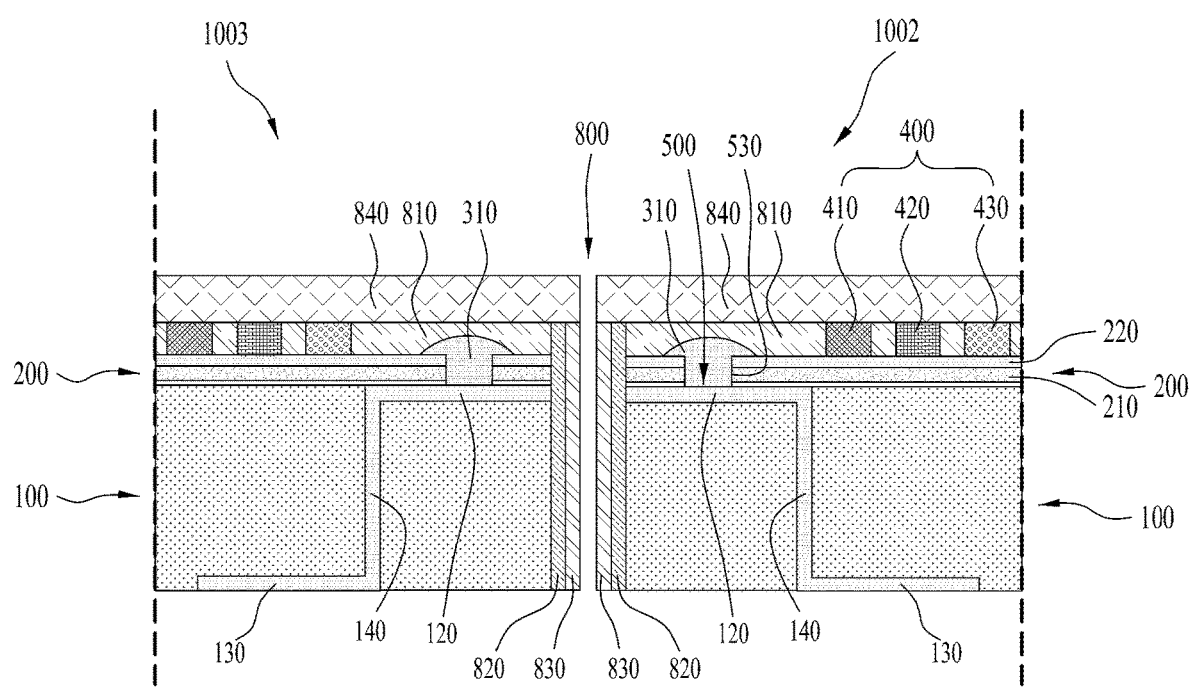
FIG. 20 is a cross-sectional view showing a module-type display device according to the second embodiment of the present disclosure.
Figure 21:
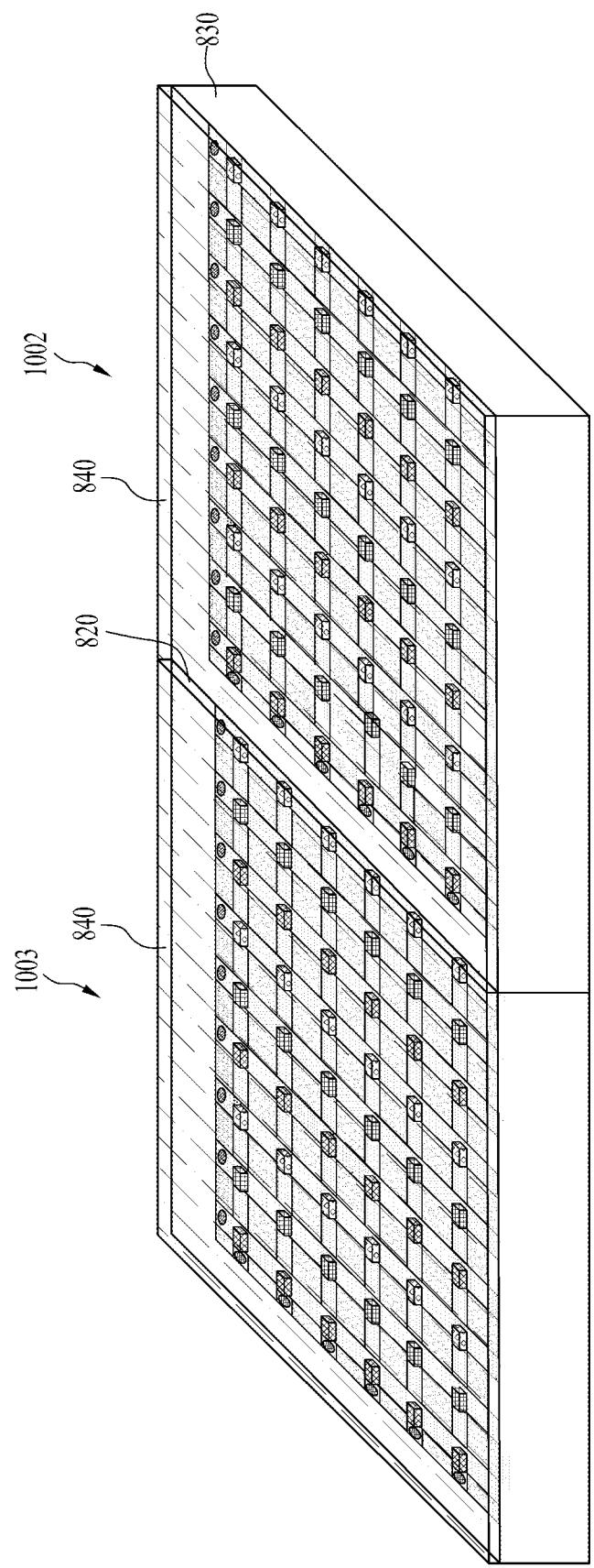
FIG. 21 is a perspective view showing the module-type display device according to the second embodiment of the present disclosure.

FIG. 20 is a cross-sectional view showing a module-type display device according to the second embodiment of the present disclosure. FIG. 21 is a perspective view showing the module-type display device according to the second embodiment of the present disclosure.

The module-type display device may be configured by bonding the display devices having the configurations of FIGS. 16 and 17 to each other.

FIGS. 20 and 21 illustrate two display devices 1002 and 1003 attached to each other as modules. However, more than two display modules may be attached to each other to form a tile-type display device. Thereby, a large-area display device may be effectively manufactured.

Referring to FIG. 20, in addition to the configuration described with reference to FIG. 17, each of the display modules 1002 and 1003 may further include a flattened layer 810 disposed on the second substrate 200. That is, a flattened layer 810 to cover the connection wire, the light emitting element 400, the connection electrode 300, and the exposed portion of the first electrode 120 may be formed on the top surface of the second substrate 200 on which the light emitting element 400 is arranged.

An optical film 840 such as a color filter may be disposed on the flattened layer 810. The optical film 840 may adjust the color of the pixel when the light emitting element 400 is turned on.

A protective layer 830 disposed at an edge side of the first substrate 100 and an end portion of the flattened layer 810 may be further provided. The protective layer 830 may protect the display structure when the display modules are bonded to each other.

A black matrix 820 may be disposed between the protective layer 830 and the edge side of the first substrate 100 and the end portion of the flattened layer 810. The black matrix 820 may improve the contrast of pixels.

As described above, the two display modules 1002 and 1003 may be bonded to each other on a bonding interface 800 such that the protective layers 830 faces each other. Thereby, a module-type display may be configured.

Referring to FIG. 20, it may be seen that the protective layers 830, the black matrices 820, and the substrate bodies 110 of the first substrates 100 are disposed at a portion where the two modules 1002 and 1003 contact each other. In this case, as described above, the substrate body 110 is a PCB. In addition, it may be seen that electrode elements such as the connection electrode 310 are not directly or indirectly exposed on the contact surface.

Accordingly, when the module-type display device is implemented, damage to the substrates 100 and 200 and the electrodes 120, 130, 140, 220, and 310 may be prevented.

In addition, when a high-resolution display device having pixels with a narrow pitch is manufactured, the connection electrode 310 may be locally configured using the exposure portion 500 (the through portion 530). Accordingly, a display with a narrow bezel, a so-called zero bezel display may be effectively manufactured. In addition, a space-efficient and design-efficient high-resolution display may be implemented. Therefore, a large-area high-resolution zero bezel display may be manufactured.

As described above, efficient wire connection may be implemented and damage to the electrodes and the substrates may be prevented. Accordingly, the reliability and quality of the display device may be improved.

The above description is merely illustrative of the technical spirit of the present disclosure. It will be apparent to those skilled in the art that various modifications and variations can be made in the present disclosure without departing from the spirit and scope of the disclosure.

Therefore, the embodiments disclosed in the present disclosure are merely illustrative of the technical spirit of the present disclosure. The scope of the technical spirit of the present disclosure is not limited by these embodiments.

The scope of the present disclosure should be construed by the appended claims, and all technical ideas within the scope equivalent thereto should be construed as being within the scope of the present disclosure.

INDUSTRIAL APPLICABILITY

According to the present disclosure, a display device using a micro light emitting diode (LED) and a module-type display device using the same may be provided.

The invention claimed is:

1. A display device comprising:
a first substrate including a first electrode disposed on a first surface of the first substrate, a second electrode electrically connected to the first electrode and disposed on a second surface of the first substrate, and a third electrode connecting the first electrode and the second electrode, wherein the first electrode is provided facing toward an edge side of the first substrate, the second electrode is provided in a direction opposite to the edge side of the first substrate, and the third electrode connects the first electrode and the second electrode through the first substrate;
a second substrate disposed on the first substrate and including a connection wire defining a plurality of individual pixel regions, the second substrate forming an exposure portion exposing at least a portion of an upper surface of the first electrode of the first substrate, wherein the exposure portion is disposed at an end portion of the second substrate and is configured to expose the upper surface of the first electrode at the edge side of the first substrate corresponding to the end portion of the second substrate;
a connection electrode contacting the exposure portion to connect the first electrode of the first substrate and the connection wire of the second substrate; and
a light emitting element connected to the connection wire of the second substrate.

2. The display device of claim 1, wherein the first substrate is a printed circuit board (PCB), and
wherein the first electrode and the second electrode are electrodes printed on the PCB.

3. The display device of claim 1, wherein the second substrate is a thin film transistor (TFT) substrate having a TFT provided in a pixel region of the plurality of individual pixel regions.

4. The display device of claim 3, wherein the TFT has a drain electrode connected to the connection wire.

5. The display device of claim 1, wherein a width of the second substrate is smaller than a width of the first substrate.

6. The display device of claim 1, wherein the exposure portion is a through portion provided at an end portion of the second substrate.

7. The display device of claim 6, wherein the connection electrode connects the first electrode of the first substrate and the connection wire of the second substrate through the through portion.

8. The display device of claim 1, wherein the edge side of the first substrate is an outer edge side of the first substrate that connects the first surface and the second surface, and
wherein a distal end of first electrode is provided at the edge side of the first substrate.

9. The display device of claim 1, wherein a portion of the connection electrode extends above a top surface of the connection wire, the top surface of the connection wire facing away from the first substrate.

10. The display device of claim 1, wherein the connection electrode is of integral form and directly contacts both the connection wire and the first electrode.

11. The display device of claim 10, wherein the connection electrode directly contacts the upper surface of the first electrode, a side surface of the connection wire, and an upper surface of the connection wire.

12. A module-type display device comprising:
at least two display modules combined with each other, each of the display modules comprising:
a first substrate including a first surface, a first electrode disposed on the first surface, a second electrode electrically connected to the first electrode and a third electrode connecting the first electrode and the second electrode, the second electrode being disposed on a second surface of the first substrate opposite to the first surface, wherein the first electrode is provided facing toward an edge side of the first substrate, the second electrode is provided in a direction opposite to the edge side of the first substrate, and the third electrode connects the first electrode and the second electrode through the first substrate;
a second substrate disposed on the first substrate and including a connection wire defining a plurality of individual pixel regions, wherein the second substrate forms an exposure portion exposing at least a portion of an upper surface of the first electrode of the first substrate and is a flexible substrate that is thinner than the first substrate, wherein the exposure portion is disposed at an end portion of the second substrate and is configured to expose the upper surface of the first electrode at the edge side of the first substrate corresponding to the end portion of the second substrate;
a connection electrode arranged to contact the exposure portion to connect the first electrode of the first substrate and the connection wire of the second substrate; and
a light emitting element connected to the connection wire of the second substrate.

13. The module-type display device of claim 12, wherein the second substrate is a flexible substrate.

14. The module-type display device of claim 12, wherein the second substrate is a resin substrate.

15. The module-type display device of claim 12, wherein each of the display modules further comprises:
a flattened layer disposed on the second substrate; and
a protective layer disposed at an edge side of the first substrate and at an end portion of the flattened layer.

16. The module-type display device of claim 15, wherein two adjacent display modules among the at least two display modules are arranged to contact each other.

17. The module-type display device of claim 16, wherein the protective layers of the two adjacent display modules are arranged to contact each other.

18. The module-type display device of claim 12, wherein the exposure portion is a through portion provided at an end portion of the second substrate.

* * * * *